(12) United States Patent
Alimo et al.

(10) Patent No.: US 12,204,821 B2
(45) Date of Patent: Jan. 21, 2025

(54) FLOORPLAN GENERATION SYSTEM AND METHODS OF USE

(71) Applicant: OPAL AI Inc., Los Angeles, CA (US)

(72) Inventors: Shahrouz Ryan Alimo, Los Angeles, CA (US); Audrey Atrshan Alimo, Los Angeles, CA (US)

(73) Assignee: OPAL AI Inc., Los Angeles, CA (US)

( * ) Notice: Subject to any disclaimer, the term of this patent is extended or adjusted under 35 U.S.C. 154(b) by 0 days.

(21) Appl. No.: 17/876,356

(22) Filed: Jul. 28, 2022

(65) Prior Publication Data

US 2023/0035601 A1 Feb. 2, 2023

Related U.S. Application Data

(60) Provisional application No. 63/203,689, filed on Jul. 28, 2021.

(51) Int. Cl.
| | |
|---|---|
| *G06F 30/13* | (2020.01) |
| *G01S 17/86* | (2020.01) |
| *G01S 17/89* | (2020.01) |
| *G06F 30/27* | (2020.01) |
| *G06T 17/00* | (2006.01) |

(52) U.S. Cl.
CPC .............. *G06F 30/13* (2020.01); *G01S 17/86* (2020.01); *G01S 17/89* (2013.01); *G06F 30/27* (2020.01); *G06T 17/00* (2013.01); *G06T 2210/04* (2013.01)

(58) Field of Classification Search
None
See application file for complete search history.

(56) References Cited

U.S. PATENT DOCUMENTS

| | | | | |
|---|---|---|---|---|
| 2009/0252382 | A1* | 10/2009 | Liu ...................... | G06V 40/193 |
| | | | | 382/117 |
| 2014/0002441 | A1* | 1/2014 | Hung ..................... | G06T 7/215 |
| | | | | 345/419 |

(Continued)

FOREIGN PATENT DOCUMENTS

| | | | | |
|---|---|---|---|---|
| CN | 109408954 A | * | 3/2019 | ............. G06F 30/13 |
| CN | 111986305 A | * | 11/2020 | ............. G06T 15/10 |

(Continued)

OTHER PUBLICATIONS

International Search Report and Written Opinion mailed on Dec. 14, 2022 in corresponding PCT Application No. PCT\US2022/038718.

(Continued)

*Primary Examiner* — Jwalant Amin

(57) ABSTRACT

The disclosure generally pertains to generating floorplans. An example method to do so involves generating a three-dimensional polygonal mesh representation of at least a portion of a building (one floor of the building, for example). The three-dimensional polygonal mesh representation is generated from images captured by a smartphone, for example. The method further includes generating an edge existence probability mask based on depth information obtained by using a LiDAR device on the smartphone, for example. The edge existence probability mask represents a confidence level associated with identifying an edge of a wall. A pictorial rendering of the building or a part of the building can be generated based on identifying edges and walls of the building by utilizing the three-dimensional polygonal mesh representation and the edge existence probability mask. The pictorial rendering may be used, for example, to provide interior design assistance with respect to a room of the building.

17 Claims, 11 Drawing Sheets

(56) References Cited

U.S. PATENT DOCUMENTS

| | | | | |
|---|---|---|---|---|
| 2021/0142497 A1* | 5/2021 | Pugh | ........................ | G06T 7/194 |
| 2021/0225090 A1* | 7/2021 | Tang | ........................ | G06F 18/21 |

FOREIGN PATENT DOCUMENTS

| | | | | |
|---|---|---|---|---|
| EP | 1622082 B1 * | 5/2012 | ........... | G06K 9/4604 |
| WO | 2019/226560 A1 | 11/2019 | | |
| WO | 2021/097126 A1 | 5/2021 | | |
| WO | 2022/147068 A1 | 7/2022 | | |

OTHER PUBLICATIONS

Habib Ayman et al: "Model-Based Automatic 3D Building Model Generation By Integrating Lidar And Aerial Images", Dec. 31, 2011 (Dec. 31, 2011), pp. 187-200, XP055982367, Retrieved from the Internet: URL:https://typeset.io/pdf/model-based-automatic-3d-building-model-generation-by-3eo6bh7iz6.pdf [retrieved on Nov. 16, 2022] abstract; figures 1, 8a-c, 9a-c p. 189, paragraph 2.1—p. 191, paragraph 2.2.

Michael Belsky et al: "Semantic Enrichment for Building Information Modeling: Semantic enrichment for building Information modeling", Compauter-aided Civil and Infrastrucutre Engineering, vol. 31, No. 4, Apr. 1, 2016 (Apr. 1, 2016), pp. 261-274, XP055459954, US ISSN: 1093-9687, DOI: 10.1111/mice.12128 the whole document.

Yastikli N. et al: "Automatic 3D Building Model Generations With Airborne LiDar Data", ISPRS Annals of the photogrammetry, Remote Sensing and Spatial Information Sciences, [Online] vol. IV-4/W4, Oct. 15, 2017 (Oct. 15, 2017), pp. 411-414, XP055982321, DOI: 10.5194/isprs-annals-IV-4-W4-411-2017 Internet Retrieved from the Internet: URL: https://www.isprs-ann-photogramm-remote-sens-spatial-inf-sci.net/IV-4-W4/411/2017/isprs-annals-IV-4-W4-411-2017.pdf> [retrieved on Nov. 18, 2022] abstract; figures 1-6.

* cited by examiner

FLOORPLAN GENERATION SYSTEM AND METHODS OF USE

CROSS-REFERENCE TO RELATED APPLICATION

The present filing claims priority to U.S. Provisional Patent Application, Ser. No. 63/203,689, filed on Jul. 28, 2021, entitled "Novel Video Processing Software For Automatic Generation Of Geometric Detection", which is hereby incorporated by reference in its entirety.

BACKGROUND

A floorplan of a building can be used for various purposes such as, for example, to provide information about a layout and a size of a house, to provide information about a layout and a size of a commercial building (office, warehouse, store, hospital, etc.), to display information about emergency exits on a floor (doors, stairs, etc.), for construction purposes, and for remodeling purposes.

One method to generate a floorplan of an existing structure (a house, an office, a store, a warehouse, etc.) involves a surveyor walking from one room to another and drawing a sketch of each room (a rectangular box outline of a room, for example). The sketch may then be updated by adding dimensional measurements (length, width, height, etc.) obtained by use of a handheld measuring device (a measuring tape, a laser measurement tool, etc.). Annotated notes may be added to provide additional information such as, for example, a location, size, and shape of a door or a window. The sketches may then be forwarded to a draftsman for producing a blueprint of the floorplan. In some cases, the blueprint may be a paper document and in some other cases, the blueprint may be produced in the form of a computer-aided design (CAD) drawing.

Preparing a floorplan in this manner has several handicaps. A first handicap pertains to an amount of manual labor involved in the documenting procedure (sketching, measuring, annotating, etc.). A second handicap pertains to costs such as surveyor fees and drafting fees. A third disadvantage pertains to an amount of time involved in performing the procedure (surveying, drafting, etc.).

It is therefore desirable to provide a solution that addresses such handicaps.

SUMMARY

In a first example embodiment in accordance with the disclosure, a method includes receiving, by a computer, an image and depth information of at least a portion of a building; generating, by the computer, based on the image, an edge existence probability mask that represents a confidence level associated with identifying an edge of a wall in the at least the portion of the building; executing, by the computer, a recursive procedure that uses the depth information to optimize the edge existence probability mask; executing, by the computer, a scene understanding procedure to derive semantic information of the at least the portion of the building; identifying, by the computer, the edge of the wall based on the optimized edge existence probability mask and the semantic information of the at least the portion of the building; and generating, by the computer, a pictorial rendering of the at least the portion of the building, the pictorial rendering including the edge of the wall.

In general, the first example embodiment is directed at a method to generate a pictorial rendering of a building or a portion of a building from image and depth information. The method involves obtaining semantic information of the building or the portion of the building based on the image. The depth information (obtained by use of a light imaging and ranging (LiDAR) device, for example) is used to generate an edge existence probability mask that can be used in conjunction with the semantic information for identifying edges and corners of a room and for generating a pictorial rendering of the building or portion of the building.

In a second example embodiment in accordance with the disclosure, a method includes receiving, by a computer, from a camera, an image of at least a portion of a building; receiving, by the computer, from a light detection and ranging (LiDAR) device, depth information associated with the at least the portion of the building; generating, by the computer, based on at least one of the image or a combination of the image and the depth information, semantic information of the at least the portion of the building; generating, by the computer, based on the monocular RGB image, an edge existence probability mask that represents a confidence level associated with identifying an edge of a wall in the at least the portion of the building; executing, by the computer, a recursive procedure that comprises a use of the depth information to optimize the edge existence probability mask; identifying, by the computer, the edge of the wall based on combining the optimized edge existence probability mask with the semantic information of the at least the portion of the building; and generating, by the computer, a pictorial rendering of the at least the portion of the building, the pictorial rendering including the edge of the wall.

In general, the second example embodiment is directed at a method to generate a pictorial rendering of a building or a portion of the building and involves obtaining sematic information of the building or the portion of the building. The image may be captured by use of a smartphone, for example. Depth information (obtained by use of a light detection and ranging (LiDAR) device, for example) is used to generate an edge existence probability mask that can be used in conjunction with the sematic information for identifying edges and corners of the building or the portion of the building and for generating a pictorial rendering of the room, the pictorial rendering including the edge of the wall.

In a third example embodiment in accordance with the disclosure, a system includes a camera, a light detection and ranging (LiDAR) device, and a computer. The computer includes a processor and a memory containing computer-executable instructions. The processor is configured to access the memory and execute the computer-executable instructions to receive, from the camera, an image of at least a portion of a building; receive, from the LiDAR device, depth information associated with the at least portion of the building; generate, based on at least one of the image or a combination of the image and the depth information, semantic information of the at least the portion of the building; generate, based on the image, an edge existence probability mask that represents a confidence level associated with identifying an edge of a wall in the at least portion of the building; execute a recursive procedure that comprises a use of the depth information to optimize the edge existence probability mask; identify the edge of the wall in the room based on combining the optimized edge existence probability mask with the sematic information of the at least the portion of the building; and generate a pictorial rendering of the at least the portion of the building, the pictorial rendering including the edge of the wall.

Further aspects of the disclosure are shown in the specification, drawings, and claims below.

BRIEF DESCRIPTION OF THE DRAWINGS

Many aspects of the invention can be better understood with reference to the following drawings. The components in the drawings are not necessarily to scale. Instead, emphasis is placed upon clearly illustrating the principles of the invention. Moreover, in the drawings, like reference numerals designate corresponding parts, or descriptively similar parts, throughout the several views and embodiments.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein. For example, it must be understood that various words, labels, and phrases are used herein for description purposes and should not be interpreted in a limiting manner.

For example, it must be understood that the word "image" as used herein can refer to a single independent image (captured by a digital camera) in an example implementation and can refer to one or more images of a video clip (captured by a video camera) in another example implementation. The label "3D" as used herein is a shortened version of the phrase "three-dimensional." The word "floor" as used herein refers in some case to an entire floor and in some other cases to a portion of a floor (one or more rooms, for example). The word "floorplan" as used herein can be understood to refer to a "floor map" which may be generally understood as a birds-eye view of the layout of a building. A "floorplan" can include details such as, dimensions, scaling, for example whereas a "floor map" may not include such details. It must also be understood that subject matter described herein with reference to the word "floorplan" is equally applicable to items that may be referred to in the art by terminology such as, for example, "measured drawing," "record drawing," and "as-built drawing." The word "rendering" and the phrase "pictorial rendering" as used herein encompass various types of pictorial diagrams produced by a computer and particularly encompass computer-aided drawings such as, for example, a floorplan, a three-dimensional (3D) drawing, an isometric view of a building, a birds-eye view of a building, and an interior view of a room in a building.

The word "example" as used herein is intended to be non-exclusionary and non-limiting in nature. One of ordinary skill in the art will understand the principles described herein and recognize that these principles can be applied to a wide variety of applications and situations, using a wide variety of tools, processes, and physical elements.

Words such as "implementation," "scenario," "case," "approach," and "situation" must be interpreted in a broad context, and it must be understood that each such word represents an abbreviated version of the phrase "In an example "xxx" in accordance with the disclosure" (where "xxx" corresponds to "implementation," "application," "scenario," "case," "situation" etc.).

Figure 1:
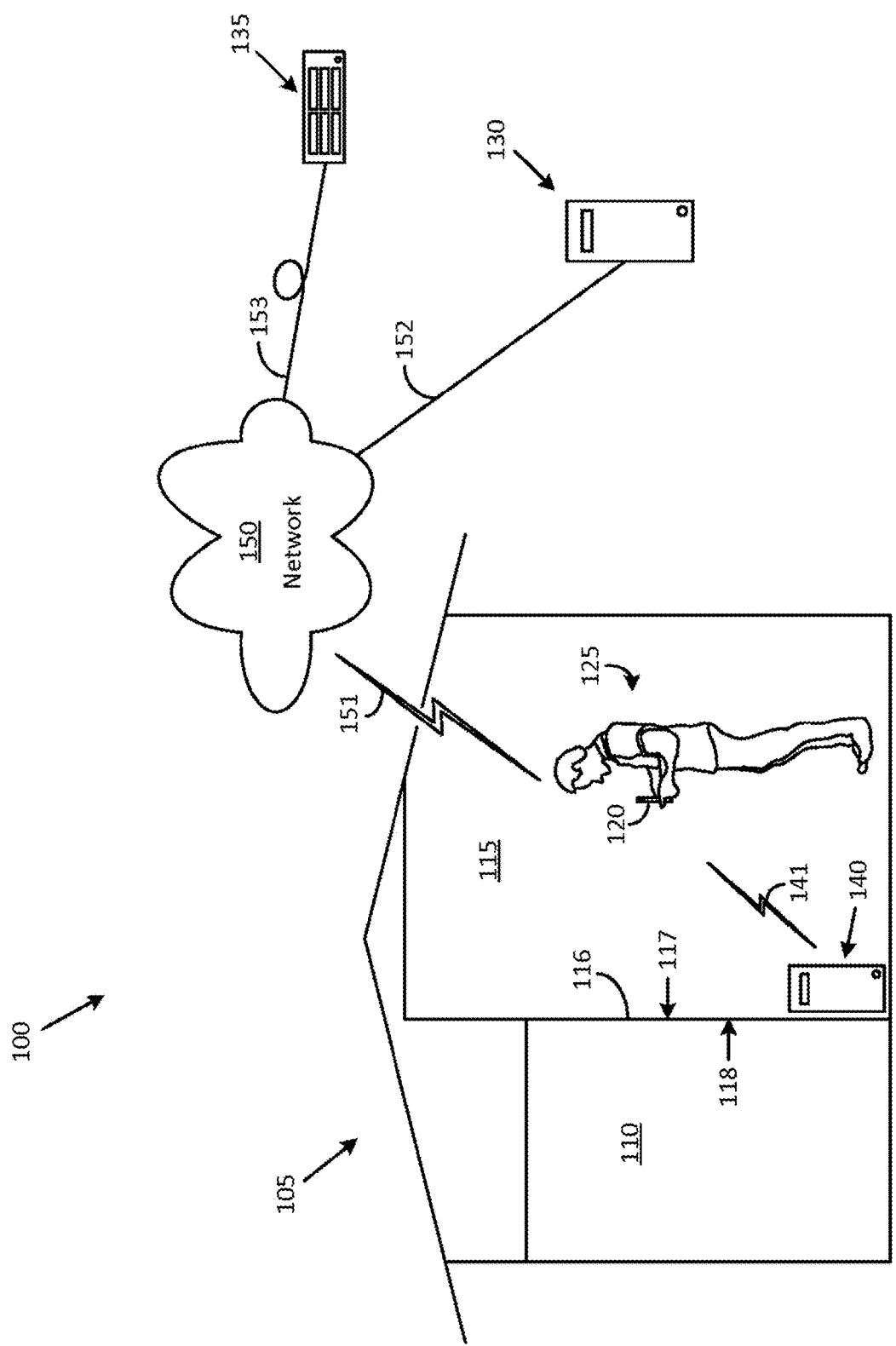
FIG. 1 shows an example implementation of a floorplan generation system in accordance with an embodiment of the disclosure.

FIG. 1 shows an example implementation of a floorplan generation system 100 in accordance with an embodiment of the disclosure. In the example configuration shown in FIG. 1, the floorplan generation system 100 has a distributed architecture where various components of the floorplan generation system 100 are provided in various example devices. The example devices include a personal device 120 carried by an individual 125, a computer 130, a cloud storage device 135, and a computer 140. In another example configuration, the floorplan generation system 100 may be wholly contained in a single device such as, for example, in the personal device 120 or in the computer 130.

The floorplan generation system 100 may be used to generate a floorplan of a floor of a building 105. The building 105 in this example scenario is a residential building having a single floor. In other scenarios, the building 105 can be any of various types of buildings having one or more floors, such as, for example, a warehouse, an office building, a store, a hospital, a school, or a multi-storied residential building.

The various devices shown in FIG. 1 are communicatively coupled to each other via a network 150. The network 150, which can be any of various types of networks such as, for example, a wide area network (WAN), a local area network (LAN), a public network, and/or a private network, may include various types of communication links (a wired communication link, a wireless communication link, an optical communication link, etc.) and may support one or more of various types of communication protocols (Transmission Control Protocol (TCP), Internet Protocol (IP), Ethernet, Post Office Protocol (POP), Simple Mail Transfer Protocol (SMT), File Transfer Protocol (FTP), Hyper Text Transfer Protocol (HTTP), and Hyper Text Transfer Protocol Secure (HTTPS), etc.)

In the illustrated scenario, the computer 130 is coupled to the network 150 via a wired link 152, the cloud storage device 135 is coupled to the network 150 via an optical link 153, and the personal device 120 is coupled to the network 150 via a wireless link 151.

The computer 130 can be any of various types of devices such as, for example, the personal device 120, a personal computer, a desktop computer, or a laptop computer. In some scenarios, the computer may be configured to operate as a server computer or a client computer. More particularly, the computer 130 can include a processor and a memory containing computer-executable instructions. The processor is configured to access the memory and execute the computer-executable instructions to perform various operations in accordance with the disclosure.

The cloud storage device 135 may be used for storing various types of information such as, for example, a database containing images and/or floorplans of various buildings.

The computer 140 can be any of various types of devices such as, for example, a personal computer, a desktop computer, or a laptop computer. The computer 140 includes a processor and a memory containing computer-executable instructions. The processor is configured to access the memory and execute the computer-executable instructions to perform various operations in accordance with the disclosure. In the illustrated example scenario, the computer 140 is communicatively coupled to the personal device 120 via a wireless link 141. The wireless link 141 may be configured to support wireless signal formats such as, for example, WiFi, Bluetooth®, near-field communications (NFC), microwave communications, optical communications, and/or cellular communications.

The personal device 120 can be any of various types of devices that operates as a computer and includes components such as, for example, a camera and a light detection and ranging (LiDAR) device. A non-exhaustive list of personal devices can include a smartphone, a tablet computer, a phablet (phone plus tablet), a laptop computer, and a wearable device (a smartwatch, for example). In the illustrated scenario, the personal device 120 is a hand-held device that is used by the individual 125 for capturing images of a room 115 and a room 110 located on a ground floor of the building 105. The images may be captured in various forms such as, for example, in the form of one or more digital images, a video clip, or a real-time video stream. The individual 125 may swivel the personal device 120 in various directions for capturing images of various objects (furniture, wall fixtures, wall hangings, floor coverings, etc.) and structural elements (walls, corners, ceiling, floor, doors, windows, etc.) of the room 115.

In one case, the individual 125 remains stationary at a first location (a central area of the room 115, for example) and points the personal device 120 in various directions for capturing a set of images. The individual 125 may then move to various other locations in the room 115 and repeat the image capture procedure. In another case, the individual 125 may capture images in the form of a real-time video stream (or a set of video clips) as the individual 125 moves around the room 115. The various images can include an image of a surface 117 of a wall 116 in the room 115.

The individual 125 may then move into the room 110 which is adjacent to the room 115, and repeat the image capture procedure. In this example, the room 110 shares the wall 116 with the room 115, and the images captured in the room 110 can include an image of a surface 118 of the wall 116. An example challenge associated with generating a floorplan of the ground floor of the building 105 is to recognize that the surface 118 and the surface 117 belong to a wall that is shared in common between the room 115 and the room 110 (in this case, the wall 116).

In an example implementation, a LiDAR device of the personal device 120 generates a laser beam that is used to obtain distance information between the personal device 120 and imaging targets (in this case, the various objects and structural elements of the room 115 and the room 110). Digital images captured by the personal device 120, and more particularly, pixels of each digital image captured by the personal device 120, can include distance information as well as various other types of information (scale, angles, time, camera settings, etc.). This information, which can be provided in the form of image metadata, can be used to convert a digital image into various formats. In an example implementation, each digital image can be converted into a three-dimensional polygonal mesh representation of an imaging target.

In a first example implementation, the personal device 120 can include a software application that operates upon the images captured by the personal device 120 and generates a floorplan of the ground floor of the building 105 in accordance with the disclosure. The floorplan can be made available to the individual 125 and/or other individuals for various purposes.

In a second example implementation, the images captured by the personal device 120 and/or the three-dimensional polygonal mesh representations of the images may be transferred to the computer 130 via the network 150. The computer 130 can operate upon the images and/or the three-dimensional polygonal mesh representations for generating a floorplan of the ground floor of the building 105 in accordance with the disclosure.

In a third example implementation, the images captured by the personal device 120 and/or the three-dimensional polygonal mesh representations of the images may be transferred to the computer 140 via the wireless link 141. The computer 140 can operate upon the images, and/or the three-dimensional polygonal mesh representations, for generating a floorplan of the ground floor of the building 105 in accordance with the disclosure.

In a fourth example implementation, the images captured by the personal device 120 and/or the three-dimensional polygonal mesh representations of the images, may be transferred to the cloud storage device 135. The cloud storage device 135 may be accessed by one or more computers (such as, for example, the computer 130) for retrieval of the images and/or the three-dimensional polygonal mesh representations for generating a floorplan of the ground floor of the building 105 in accordance with the disclosure.

Figure 2:
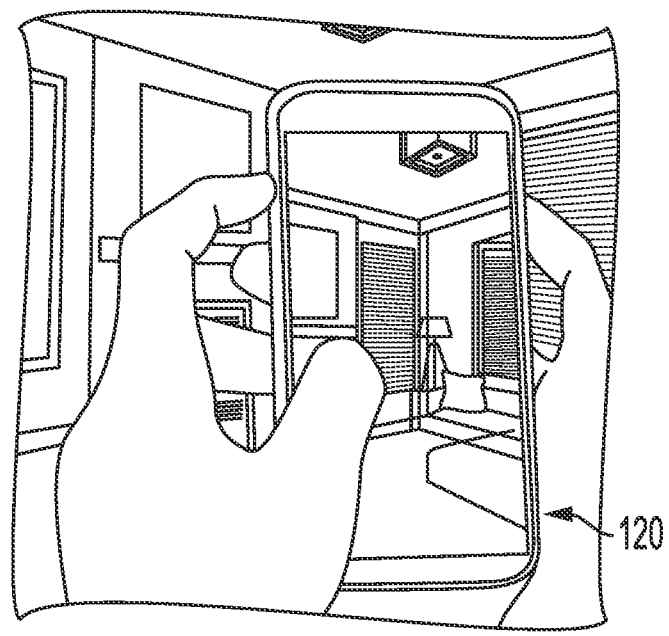
FIG. 2 illustrates an example image capture procedure in accordance with the disclosure.

FIG. 2 illustrates an example image capture procedure in accordance with the disclosure. The example procedure can be executed by use of the personal device 120. In this case, the image being captured by the personal device 120 corresponds to one view of the room 115. Additional images corresponding to other views of the room 115 may be captured and all the images (and/or three-dimensional polygonal mesh representations) may be combined to provide a comprehensive view of the room 115 in the form of a three-dimensional polygonal mesh representation, for example. The comprehensive view of the room 115 may then be combined with comprehensive views of other rooms such as, for example, the room 110. The combining procedure can be executed by a processor of the personal device 120 and/or a computer such as, for example, the computer 130. The combining procedure can be followed by a floorplan generation procedure for generating a floorplan of the ground floor of the building 105. Floorplans of other floors (in the case of a multi-storied building) can be generated in a similar manner.

Figure 3:
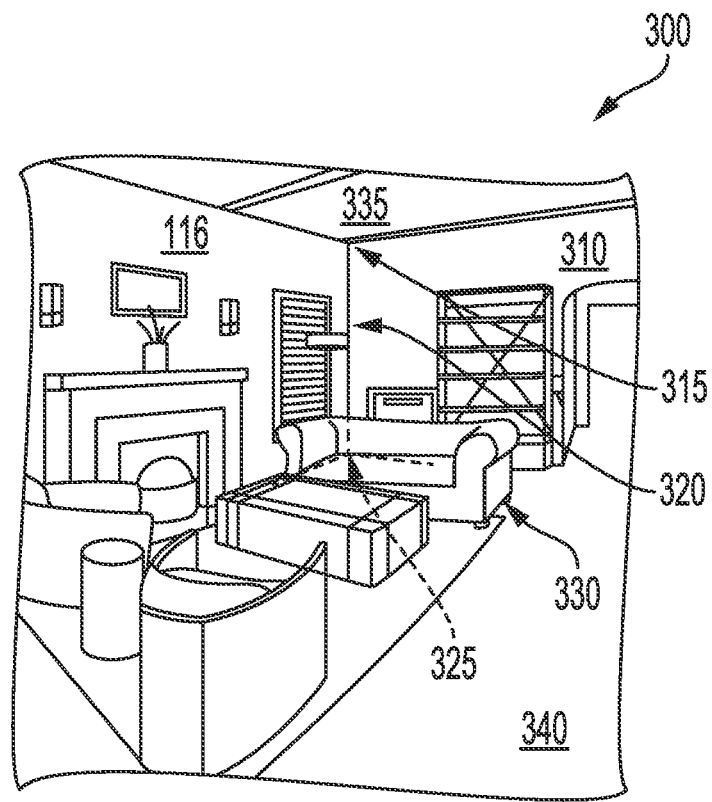
FIG. 3 illustrates an example image that may be captured by a personal device in accordance with the disclosure.

FIG. 3 illustrates an example image 300 that may be captured by the personal device 120 in accordance with the disclosure. The image 300 corresponds to one view of the room 115. The view encompasses various objects and structural elements of the room 115. The various objects include various pieces of furniture (such as, for example, a sofa 330), wall hangings, wall fixtures, and floor coverings (an area rug, for example). The room 115 includes various structures such as, for example, walls, windows, doors, and a fireplace. The walls include structural components such as, for example, an edge 320, a corner 315, and a corner 325.

The edge 320 corresponds to a vertical joint formed by the wall 116 and a wall 310. The vertical joint extends from the floor 340 to the ceiling 335 of the room 115 and includes a corner 315 and a corner 325. The corner 315 exists at a confluence location where the wall 116 and the wall 310 meet the ceiling 335. The corner 325 exists at a confluence location where the wall 116 and the wall 310 meet the floor 340.

The corner 325 and a portion of the edge 320 are obscured by the sofa 330. Evaluation of the image 300 by a human may allow the human to make an assumption that the edge 320 extends down to the floor 340, and that the corner 325 is formed at the confluence of the wall 116, the wall 310, and the floor 340. However, in some scenarios, the assumption may be erroneous, such as, for example, when the edge 320 extends non-linearly and terminates above the floor 340 (at a ledge, for example). The non-linear edge and the ledge are obscured by the sofa 330 in the image 300.

A computer, such as, for example, the computer 130, may evaluate a three-dimensional polygonal mesh representation of the room 115. The three-dimensional polygonal mesh representation can include a first element (a line, for example) corresponding to the edge 320 and a second element (a dot, for example) corresponding to the corner 325. As indicated above, the corner 325 and a portion of the edge 320 (the portion obscured by the sofa 330) may or may not exist in the room 115. Consequently, the computer has to evaluate the three-dimensional polygonal mesh representation to determine an authenticity of the first element (the line) and/or the second element (the dot) included in the three-dimensional polygonal mesh representation. If the first element (the line) is authentic, the computer may generate a rendering (a floorplan, for example) that includes the portion of the edge 320 obscured by the sofa 330. Conversely, if the first element (the line) is merely an aberration or artifact, the computer may generate a rendering (a floorplan, for example) that excludes the portion of the edge 320 obscured by the sofa 330. The corner 325 may be similarly included or excluded in the rendering by the computer based on authenticity. Objects such as furniture, wall hangings, wall fixtures, and floor coverings are typically excluded in the rendering.

In an example implementation in accordance with the disclosure, the computer 130 may make evaluate the three-dimensional polygonal mesh representation of the room 115 (and other rooms in the building 105) by executing a software program that utilizes one or more procedures such as, for example, a learning procedure, a simulation procedure, an artificial intelligence procedure, and/or an augmented intelligence procedure.

Identifying corners and edges in view of the example scenarios described above, is a second example challenge associated with generating a floorplan of the ground floor of the building 105, in addition to the first challenge described above with respect to recognizing that the surface 118 and the surface 117 belong to the wall 116 that is shared between the room 115 and the room 110.

Another challenge associated with generating a floorplan is determining characteristics of various elements such as, for example, a corner or a wall. In an example scenario, the wall 310 and/or the wall 116 may have a non-linear surface contour (curves, wall segments, protrusions, indentations, etc.). In another example scenario, the wall 310 may not be orthogonal to the wall 116 (and/or to the ceiling 335) at various places, including at the corner 315. Furthermore, the wall 310 may not run parallel to another wall (not shown) in the room 115. Accordingly, in accordance with the disclosure, the computer may evaluate a birds-eye view of the room 115 to determine various characteristics of corners and/or walls such as, for example, to determine whether the wall 310 runs parallel to the other wall. If not parallel, the computer generates a floorplan that indicates the characteristics of the wall 310 and also provides measurement values that can be used to determine separation distances between the wall 310 and the other wall at any desired location along the wall 310. In an example case, the computer may attach tags to various elements. The tags may be used to provide various types of information about the elements.

Figure 4:
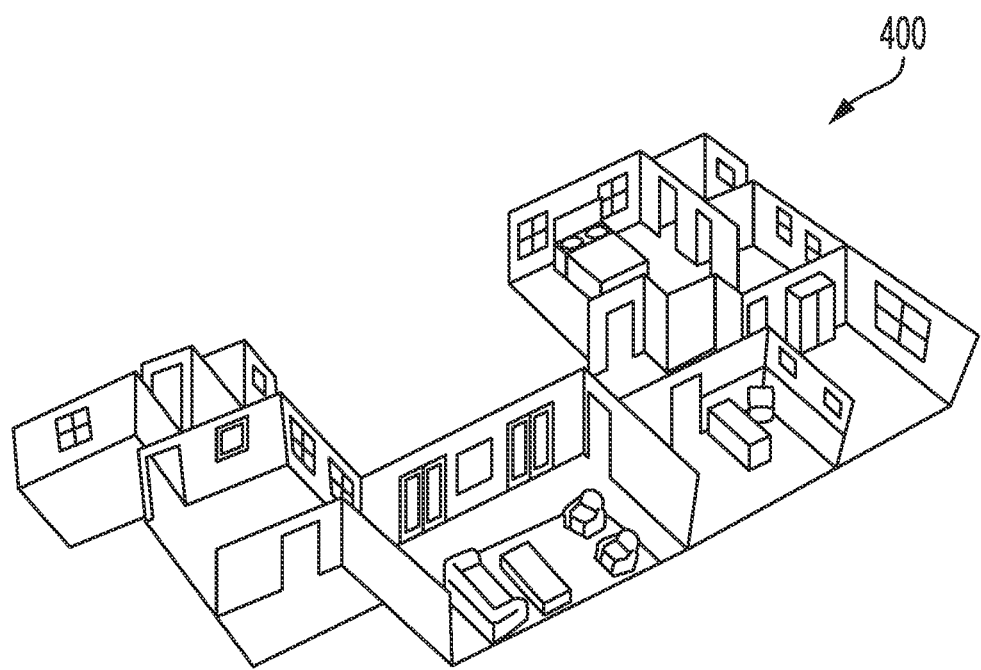
FIG. 4 illustrates an example framework that may be operated upon by a computer for generating a 3D rendering of a floor of a building in accordance with the disclosure.

FIG. 4 illustrates an example framework 400 that may be operated upon by a computer (such as, for example, the computer 130) to generate a 3D rendering of a building. The building in this example, includes multiple rooms each of which can include various objects (furniture, wall fixtures, wall hangings, floor coverings, etc.) and structural elements (windows, doors, fireplace, walls, etc.). It is desirable to exclude the various objects (furniture, wall fixtures, wall hangings, floor coverings, etc.) in order to generate a floorplan of the floor of the building.

Figure 5:
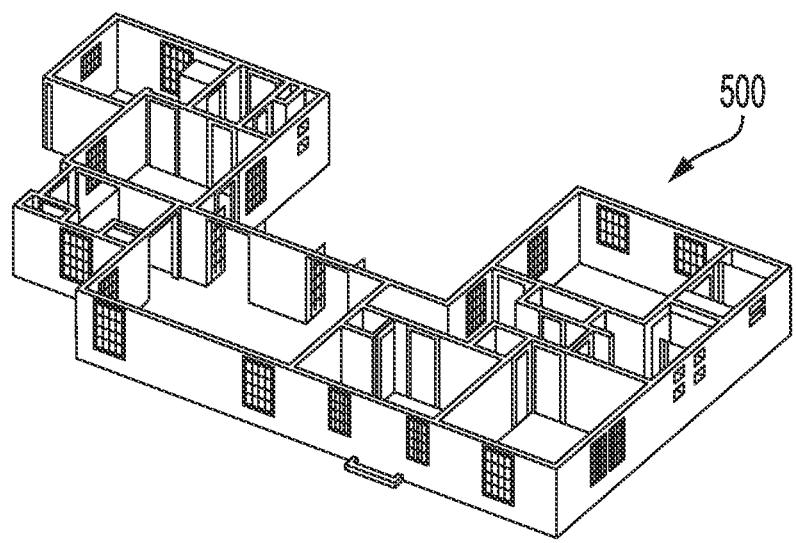
FIG. 5 illustrates an example 3D rendering of a floor of a building in accordance with the disclosure.

FIG. 5 illustrates an example 3D rendering 500 of the building that is shown in FIG. 4. The 3D rendering 500 is one example of a pictorial rendering that is generated by a computer such as, for example, the personal device 120 or the computer 130. The 3D rendering 500 is generated by executing a software program that identifies and excludes various objects contained in the example framework 400 described above. Objects, particularly removable objects, are generally undesirable for inclusion in a floorplan because the floorplan is typically directed at providing information about structural details of the building. In an example implementation, the 3D rendering 500 can be generated in the form of a textured 3D rendering, using techniques such as, for example, artificial intelligence and/or augmented intelligence.

Figure 6:
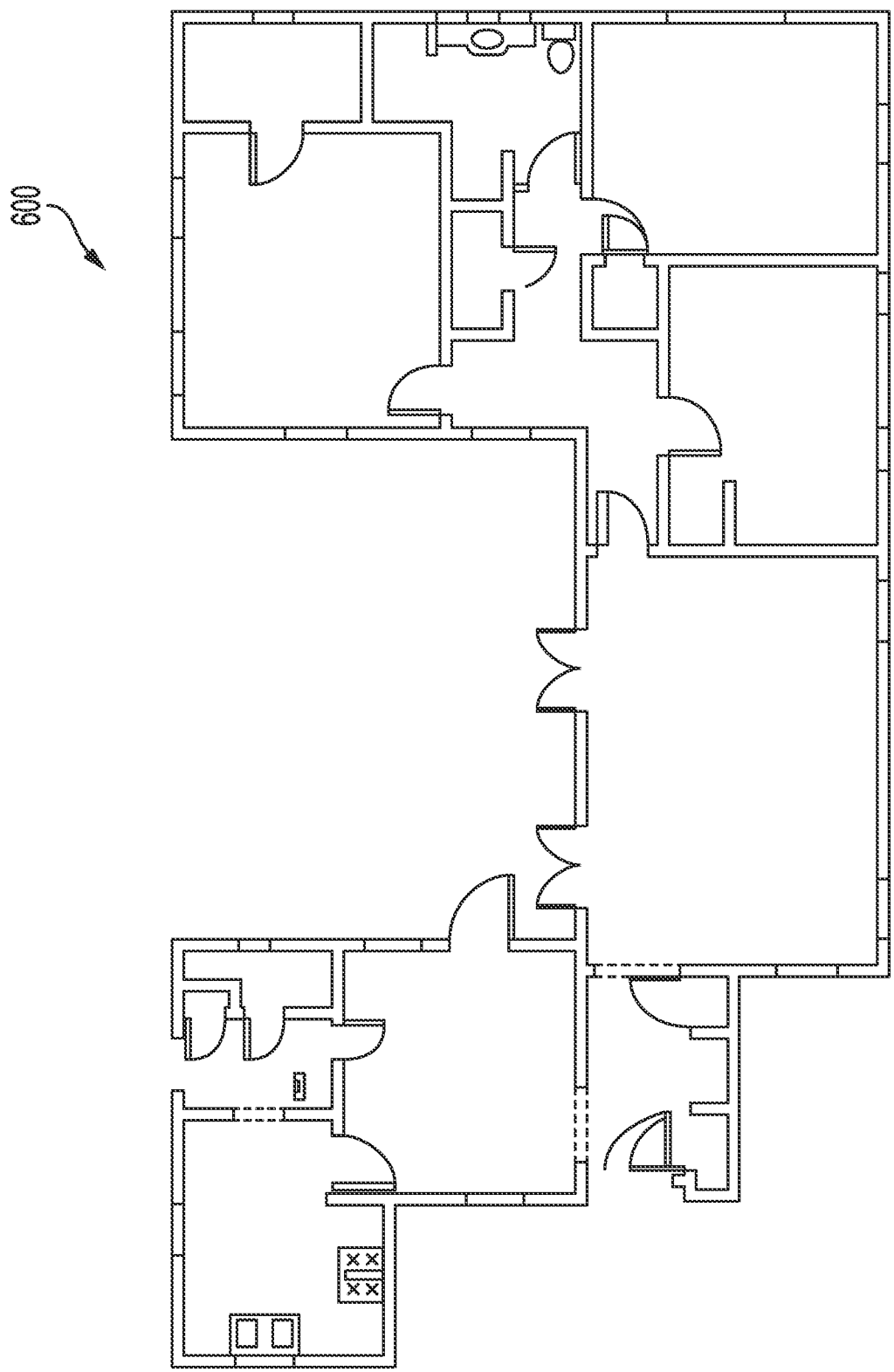
FIG. 6 shows an example floorplan in accordance with the disclosure.

FIG. 6 illustrates a floorplan 600 of the floor of the building that is shown in FIG. 4. The floorplan 600, which is another example of a pictorial rendering, may be generated by a computer such as, for example, the personal device 120 or the computer 130. The floorplan 600 may be generated by executing a software program that converts the 3D rendering 500 into a birds-eye view of the building. Additional details pertaining to this procedure are provided below. The floorplan 600 includes various structural details of the building such as, for example, dimensions of various rooms (width, length, height, floor area, etc.), shapes of various rooms (rectangular, irregular, oval, etc.), dimensions and locations of doors and windows, and orientation (angular walls, curved walls).

In this example implementation, the floorplan 600 includes an entire floor of the building. In another implementation, the floorplan 600 can omit certain portions of the building such as, for example, several rooms other than a living room, for example. The floorplan of the living room may be used, for example, for purposes of renovating the living room based on an interior design procedure.

Figure 7:
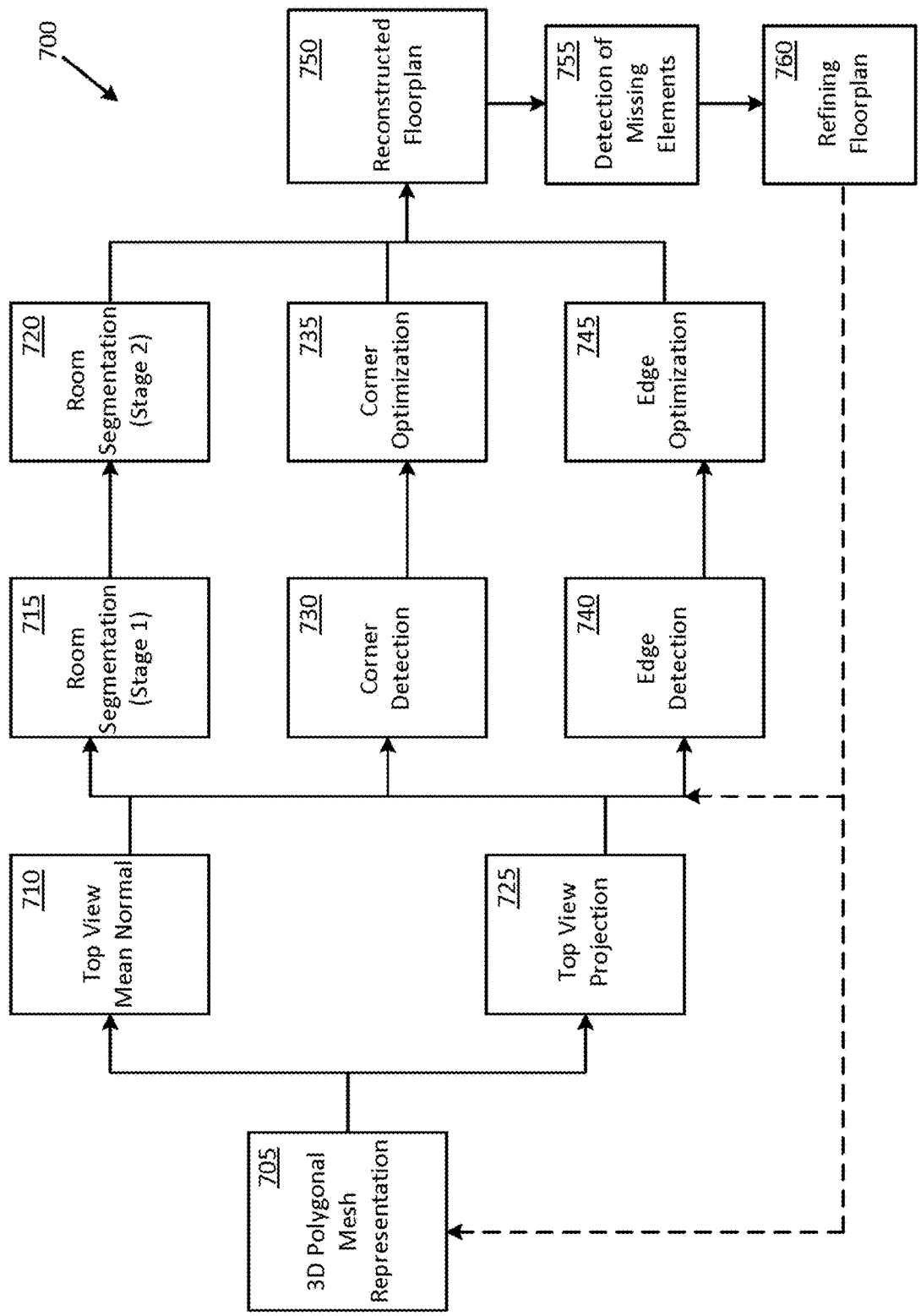
FIG. 7 shows a block diagram of a method to generate a floorplan in accordance with an embodiment of the disclosure.

FIG. 7 shows a block diagram 700 of a method to generate a floorplan in accordance with an embodiment of the disclosure. The functional blocks shown in the block diagram 700 can be implemented by executing a software program in a computer, such as, for example, the personal device 120 or the computer 130. Block 705 pertains to a three-dimensional polygonal mesh representation that can be generated from an image captured by the personal device 120. In an example implementation, the image is a red-green-blue image (RGB image) having metadata associated with parameters such as, for example, distances, angles, scale, time, and camera settings. Distance parameters may be derived from information generated by a LiDAR device that can be a part of the personal device 120. The LiDAR device uses a laser beam to generate depth information and/or to generate distance information between a camera and imaging targets such as, for example, walls, doors, windows, etc. In an example scenario, the distance information is generated by using a time-of-flight (ToF) measurement. Camera settings information may be obtained from an inertial measurement unit (IMU) of the personal device 120.

In an example scenario, a series of synced RGB images may be obtained by executing a sequential image capture procedure (capturing images while walking from one room to another, for example). The synced RGB images, which can include depth information, can then be used to generate a three-dimensional polygonal mesh representation.

The three-dimensional polygonal mesh representation can be converted to a top view mean normal rendering (block 710) and a top view projection rendering (block 725). The top view mean normal rendering and/or the top view projection rendering can be operated upon for performing operations such as, for example, room segmentation (block 715 and block 720), corner detection (block 730), and edge detection (block 740).

Stage 1 of room segmentation (block 715) may involve segmenting the top view mean normal rendering and/or the top view projection rendering into individual rooms. The segmenting procedure may involve the use of procedures such as, for example, machine learning, density-based spatial clustering of applications (DBSCAN), and random sample consensus (RANSAC).

Stage 2 of room segmentation (block 720) may involve evaluating each room for identifying various structures (walls, doors, windows, etc.) that are actually present in the room, and to exclude non-existent elements that may be indicated in the three-dimensional polygonal mesh representation. In some cases, a non-existent element may be introduced into a three-dimensional polygonal mesh representation as a result of an erroneous interpretation of content present in an RGB image. In an example scenario, the non-existent element may be introduced into the three-dimensional polygonal mesh representation during image conversion when, for example, a spot in an image may be erroneously interpreted as a corner, or a straight edge of a piece of furniture may be erroneously interpreted as an edge of a wall.

Distinguishing between structures that are actually present in a room versus non-existent elements (false positives) can be carried out in various ways. In one example approach, a processor can determine a likelihood of an existence of a structure in a room by using tools such as a likelihood model and/or an edge existence probability mask (described below in further detail). In another example approach, a processor can determine a likelihood of an existence of a structure in a room by comparing the top view mean normal rendering and/or the top view projection rendering of the room to one or more template renderings.

A layout relationship between multiple rooms of the building may be determined based on identifying various doors that interconnect various adjacent rooms. Rooms having walls that are external walls of the building may be identified based on the layout of objects such as doors and windows on a periphery of the building. Various floor area measurements of various rooms of the building may be evaluated in order to determine size parameters such as, for example, gross living area (GLA), gross floor area, net floor area, open space calculation, and lot coverage calculation. The gross living area, which can be calculated based on the exterior size of the building can provide information pertaining to wall thickness of various walls. On the other hand, net floor area provides information about an interior portion of the building, such as, for example, a square footage of the inside of a room. Such size parameters may be particularly useful to lenders, property appraisers, architects, designers, engineers, inspectors, insurers, gaming companies, and virtual reality/artificial reality (VR/AR) developers.

In an example procedure, a template rendering can be generated by executing a simulation procedure. In another example procedure, a template rendering can be a rendering corresponding to another building that is similar, or substantially identical, to the building from which the three-dimensional polygonal mesh representation of block 705 has been generated. The template renderings may be stored in a database of the computer 130 and/or in the cloud storage device 135. Additional details pertaining to room segmentation (block 720) are provided below.

Block 730 pertains to corner detection based on evaluating top view mean normal rendering and/or the top view projection rendering using techniques such as the ones described above with reference to block 720 (likelihood of existence, template renderings, etc.). Additional details pertaining to corner detection are provided below.

Block 735 pertains to corner optimization where non-existent corners are excluded and a modified rendering is created. In an example operation, a non-existent corner of two walls may be excluded and replaced by a single wall.

Block 740 pertains to edge detection based on evaluating top view mean normal rendering and/or the top view projection rendering using techniques such as the ones described above with reference to block 720 (likelihood of existence, template renderings, etc.).

Block 745 pertains to edge optimization where non-existent edges are excluded and a modified rendering is created. In an example operation, a non-existent edge on a wall may be excluded. Additional details pertaining to edge detection and edge optimization are provided below.

Block 750 pertains to producing a reconstructed floorplan based on operations indicated in block 720, block 735, and block 745. At block 755, various elements that may be missing in the reconstructed floorplan such as, for example, a wall or a corner, may be identified. In block 760, the reconstructed floorplan is refined based on actions indicated in block 755. In an example implementation, the reconstructed floorplan is refined by executing a software application that compares the reconstructed floorplan to one or more reference floorplans of other buildings. In at least some cases, a reference floorplan can be simulated floorplan of another building that may, or may not, be substantially similar to the building corresponding to the three-dimensional polygonal mesh representation indicated in block 705. The software application may execute some of such operations based on machine learning and neural networks.

In an example embodiment in accordance with disclosure, the reconstructed floorplan is refined by executing a manual interactive procedure. The manual interactive procedure may be executed by one or more individuals upon one or more devices. In an example scenario, the individual 125 may execute the manual interactive procedure upon the personal device 120. In another example scenario, an individual may execute the manual interactive procedure upon the computer 130. The manual interactive procedure is generally directed at manually modifying the reconstructed floorplan that has been generated automatically by a device such as, for example, the personal device 120 or the computer 130. A non-exhaustive list of modifications can include, for example, eliminating an object present in the reconstructed floorplan, modifying a measurement in the reconstructed floorplan, and/or introducing a measurement into the reconstructed floorplan.

Eliminating an object present in the reconstructed floorplan may be carried out, for example, by the individual examining the reconstructed floorplan, noticing the presence of an object that is undesirable for inclusion in a rendered floorplan (the sofa 330, for example), and eliminating the object from the reconstructed floorplan.

Modifying a measurement in the reconstructed floorplan may be carried out, for example, by the individual examining the reconstructed floorplan, noticing an erroneous measurement, performing a manual measurement operation (using a tape measure to measure a distance between two walls, for example), eliminating the erroneous measurement indicated in the reconstructed floorplan (or applying a strike-through to the measurement indicated in the reconstructed floorplan), and inserting (or overwriting) the erroneous measurement with the measurement obtained via the manual measurement operation.

Introducing a measurement into the reconstructed floorplan may be carried out, for example, by the individual examining the reconstructed floorplan, noticing an omission of a measurement, performing a manual measurement operation (using a tape measure to measure a distance between two walls, for example), and inserting into the reconstructed floorplan, the measurement obtained via the manual measurement operation.

In another example scenario, the measurement indicated in the reconstructed floorplan can be an absolute value measurement and the insertion by the individual can provide an indication of a relative relationship. Thus, for example, an absolute value measurement may indicate a separation distance of 20 feet between a first wall and a second wall. The individual may provide an insertion such as, for example, "a separation distance between a first corner of the first wall and a first corner of the second wall is less than a separation distance between a second corner of the first wall and a second corner of the second wall."

The refined floorplan may then be used for various purposes such as, for example, to produce a rendering of a floorplan (such as, for example, the floorplan 600 shown in FIG. 6) and/or to implement a procedure for refining some operations indicated in the block diagram 700. The refining can include, for example, modifying some actions associated with operating upon the three-dimensional polygonal mesh representation indicated in block 705 and/or modifying some actions indicated in block 715, block 730, and/or block 740.

In an example implementation, operations indicated in the block diagram 700, may be performed by execution of one or more recursive procedures. One example of a recursive procedure is indicated by a dashed line connecting block 760 to block 705 and another dashed line connecting block 760 to block 715, block 730, and block 740. In an example application, a recursive procedure can be executed using a neural network that is configured to operate based on machine learning. One example of a neural network is a convolutional neural network (CNN). Machine learning can involve emulating actions performed by an individual during a manual interactive procedure.

In an example implementation, a machine learning process can involve three stages. A first stage of the three stages can involve the personal device 120 or the computer 130 operating as a passive participant in a learning mode. In the learning mode, the personal device 120 or the computer 130 merely observes actions performed by the individual and stores information associated with these actions. In a second stage of the three stages, the personal device 120 or the computer 130 operates as a partner to the individual in executing actions associated with producing the reconstructed floorplan 750. In this role, the personal device 120 or the computer 130 may perform certain operations that have been learned in stage 1. The individual may intervene to remedy, rectify, or modify some of these actions.

In a third stage, the personal device 120 or the computer 130 operates autonomously and executes various operations for producing the reconstructed floorplan 750 without human participation, and based on the learning carried out in stage 1 and stage 2. The reconstructed floorplan 750 can be used for various purposes including, in an example application, for providing interior design assistance for one or more rooms of a building. This application is described below in further detail.

Figure 8:
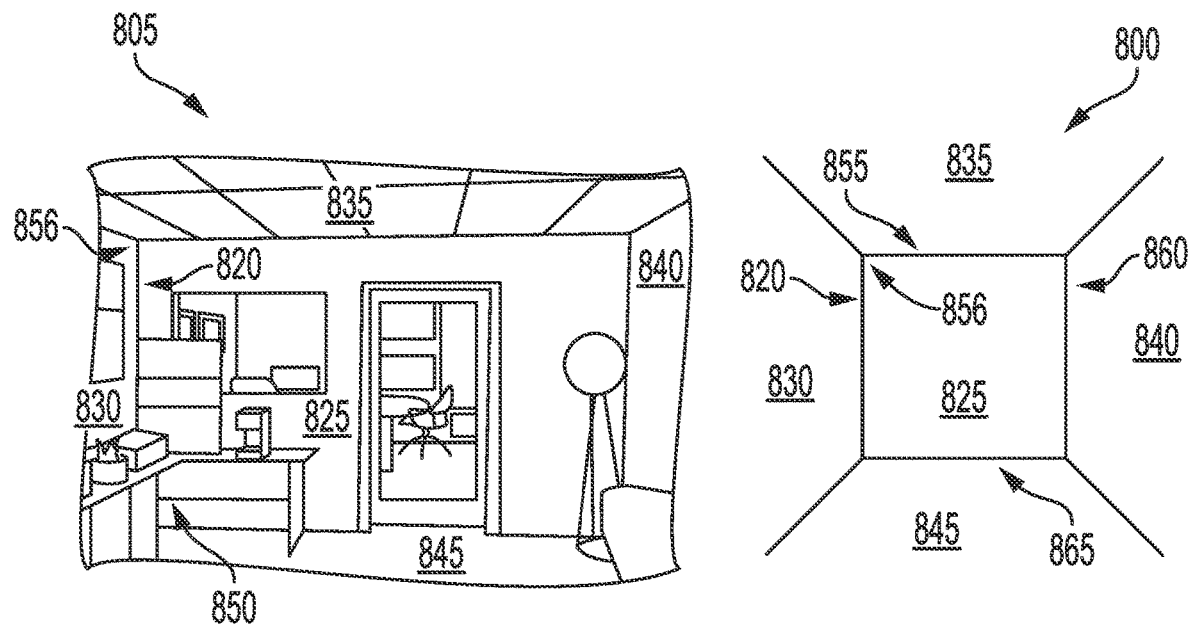
FIG. 8 illustrates a first example segmentation diagram associated with a first type of room in accordance with an embodiment of the disclosure.

FIG. 8 illustrates a first example segmentation diagram 800 associated with an example room 805 in accordance with an embodiment of the disclosure. The room 805 may be categorized as a first type of room among several types of rooms that may be categorized and/or characterized in various ways. More particularly, the room 805 includes a ceiling 835, a floor 845, and three walls. The three walls include a wall 830, a wall 825, and a wall 840. The wall 825 shares an edge 820 with the wall 830, an edge 855 with the ceiling 835, an edge 860 with the wall 840, and an edge 865 with the floor 845. A confluence of the wall 830, the wall 825, and the ceiling 835 is represented by a corner 856. The corner 856 can be a key point that constitutes a vertex in a 2D or a 3D polygonal mesh representation (block 705 described above).

This disclosure refers to various features of the room 805 (wall, edges, corners, etc.) for purposes of description. However, it must be understood that the description is equally applicable to these features that may be present in other areas of a building, including, on exterior areas of the building. Thus, for example, a description pertaining to identifying the edge 820 is equally applicable to various other edges such as, for example, an edge of a door, an edge of the building, or an edge of a roof the building. Similarly, a description pertaining to a wall in the room 895 is equally applicable to various planar surfaces of a building such as, for example, an exterior wall of the building, an exterior surface of a roof of the building, and an exterior surface of a door in the building.

The personal device 120 described above may be used to capture an image (or a video clip) of the room 805 as a part of a floorplan generation procedure in accordance with the disclosure. In an example scenario, a camera of the personal device 120 may fail to capture various elements of the room 805 with a level of resolution that allows an unambiguous identification of various features of the room 805. For example, the edge 855 may be defocused and/or may be displaced as a result of an image aberration. As another example, the edge 820 and/or the corner 856 may be defocused.

Furthermore, only an upper portion of the edge 820 is visible in the image. A lower portion of the edge 820 is obscured by an object, which is a table 850 in this example illustration. Consequently, identifying of various edges and corners of the room 805 presents a challenge. Various procedures to do so are described below.

Figure 9:
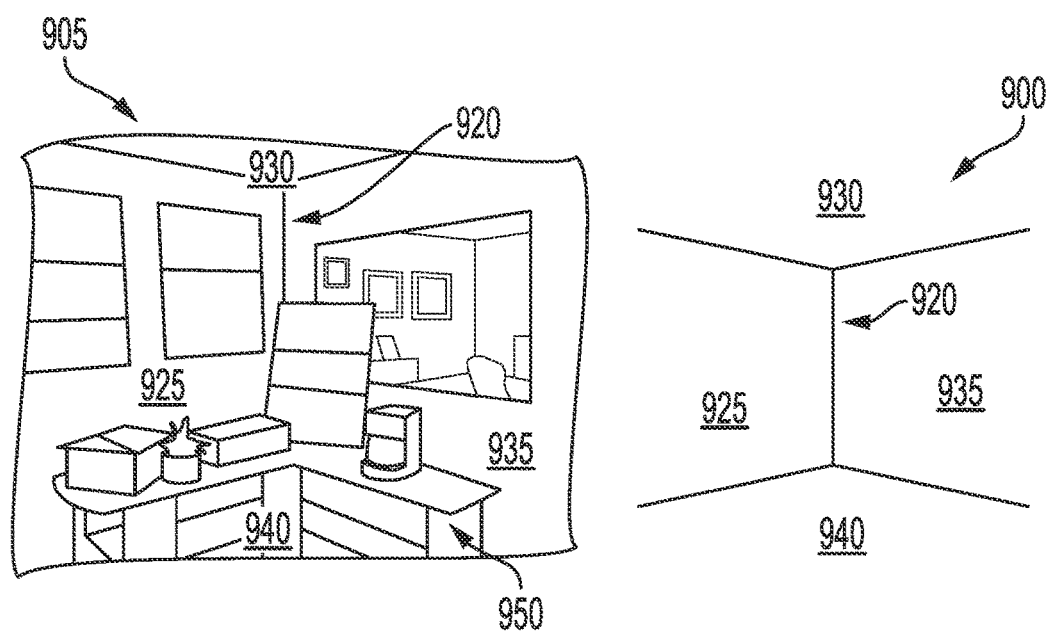
FIG. 9 illustrates a second example segmentation diagram associated with a second type of room in accordance with an embodiment of the disclosure.

FIG. 9 illustrates a second example segmentation diagram 900 associated with an example room 905 in accordance with an embodiment of the disclosure. The room 905 may be categorized as a second type of room among several types of rooms that may be categorized and/or characterized in various ways. More particularly, the room 905 includes a ceiling 930, a floor 940, and two walls. The two walls include a wall 925 and a wall 935 that share an edge 920.

The personal device 120 described above may be used to capture an image of the room 905 as a part of a floorplan generation procedure in accordance with the disclosure. In an example scenario, a camera of the personal device 120 may fail to capture various elements of the room 905 with a level of resolution that allows an unambiguous identification of various features of the room 905. For example, only one portion of the edge 920 may be visible in the image. A second portion (lower portion) of the edge 920 is not visible in the image because the second portion is occluded by an object (a table 950, in this example scenario). Identification procedures for identifying various edges such as, for example, the edge 920, and various other elements of the room 905 are described below.

Figure 10:
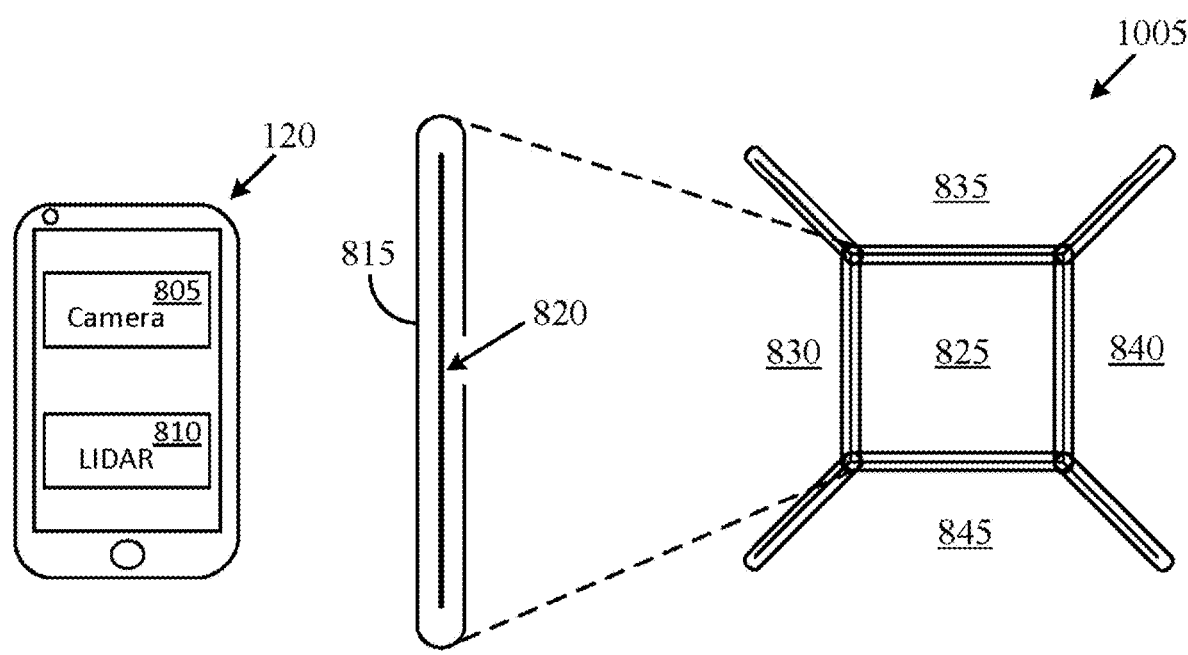
FIG. 10 illustrates a first example segmentation representation associated with an example segmentation procedure to identify an edge in a room in accordance with an embodiment of the disclosure.

FIG. 10 illustrates a first example segmentation representation 1005 associated with an example segmentation procedure to identify various edges and corners of the room 805 referred to above. The description below may refer specifically to the edge 820 and the corner 856 for purposes of description. However, it must be understood that the description is equally applicable to other edges and corners of the room 805 as well as, generally, to edges and corners of any room in accordance with the disclosure.

As described above, an image of the room 805 may fail to disclose various elements of the room 805 with a level of resolution that allows an unambiguous identification of various features of the room 805 such as, for example, walls, corners, and edges of walls. The use of the segmentation representation 1005 provides one solution to address this issue. More particularly, the segmentation representation 1005 includes a set of edge existence probability masks that provide an indication of a confidence level associated with identifying various wall edges in the room 805.

For example, an edge existence probability mask 815 provides an indication of a confidence level associated with identifying the edge 820 in the room 805. More particularly, the edge existence probability mask 815 represents an area of uncertainty inside which the edge 820 actually exists. More particularly, the edge existence probability mask 815 can be used to identify an existence and a precise location of the edge 820 of the wall 825. In the example illustration, the edge existence probability mask 815 straddles the edge 820 and extends over a length of the edge 820.

In an example embodiment, the edge existence probability mask 815 is generated based on a monocular red-green-blue (RGB) image of the room 805. The monocular RGB image can be captured by a camera 805 that can be a part of the personal device 120. The edge existence probability mask 815 can be optimized by executing a recursive procedure based on three-dimensional (3D) information, particularly, depth information pertaining to the room 805. The depth information may be obtained by operating a LiDAR device 810 of the personal device 120. The recursive procedure can be executed by the personal device 120 using various techniques such as, for example, machine learning, optimization techniques, and neural network techniques including, for example, convolutional neural network (CNN) techniques.

The edge 820 may then be detected by performing operations such as identifying pixel points in the RGB image and overlapping a 3D polygonal mesh representation of the room 805 upon the edge existence probability mask 815. Identification of the edges provides identification of various corners of the room 805.

Generating the edge existence probability mask 815 based on a monocular red-green-blue (RGB) image of the room 805 can involve various operations such as extracting various key points from the segmentation representation 1005 and optimizing an overlap between the segmentation representation 1005 and pixels in the RGB image. Significantly, in accordance with the disclosure, edges that are occluded (such as, for example, a portion of the edge 820 that is occluded by the table) can be identified in their entirety without applying specific procedures to isolate and take into consideration occluding objects.

In an example embodiment, identifying edges, walls, and key points of a room may be carried out by first defining a graphical expression on the basis of a room type. Example room 805 corresponds to a first room type. More particularly, a graphical expression for each room type "i" may be defined as G[V,E] where V and E denote key points (corners) and edges respectively.

An optimization model may then be used for performing a segmentation procedure. An example segmentation procedure can include four classes of pixels (background (bg), wall-floor edge (wf), wall-wall edge (ww), and wall-ceiling edge (wc)) that can be defined by a set S as follows:

$$S=\{bg,wf,ww,wc\}$$

A corner detection method based on neural network may then be used for estimating the initial estimate location of the key points in the rooms as a set of points indicated by V.

For each room type i, an edge set E can be defined as follows:

$$E_i=\{E_{ik}|E_{ik}=(a_k,b_k,c_k);c_k\in S,a_k,b_k\in V,a_k\neq b_k\}$$

A feature map generated from key points can be denoted as $M[V_i]$ and can be used to infer a layout of the room 805 based on key points. An optimization process for identifying various features of the room 805 can be represented by the following formula where $L_M$ and $L_N$ are the number of pixels in an image.

$$J(V_i) = \frac{1}{L_M L_N} \sum_{m=1}^{L_M} \sum_{n=1}^{L_N} \delta(m, n).M[V_i](m, n)$$

An indicator function can be used for defining the edge existence probability mask 815. The indicator function that can be defined as follows:

$$\delta(m, n) = \begin{cases} P, & \text{if } G[V_i](m, n) = M[V_i](m, n) \\ 0, & \text{otherwise} \end{cases}$$

Where P can be defined a Gaussian function in a form of Gaussian mixture model or it can be a constant more than 0 such as 1.

An estimated room type r may be determined for any room by determining a maximizer of an objective function for each room type. The objective function to do so is as follows:

$$r = \arg\max_i J(V_i)$$

In an example implementation, initial position information of various key points may be provided by an individual who is familiar with the room. The initial information may be operated upon by the personal device 120 by execution of a software program that can include a neural network procedure to move the key points around. In one case, the key points may be moved around based on a recursive reduction in step size until the objective function is invariant. The key points are constrained to move only within the area defined by the edge existence probability mask 815. An optimization search method may be used to identify a room type with highest probability.

Figure 11:
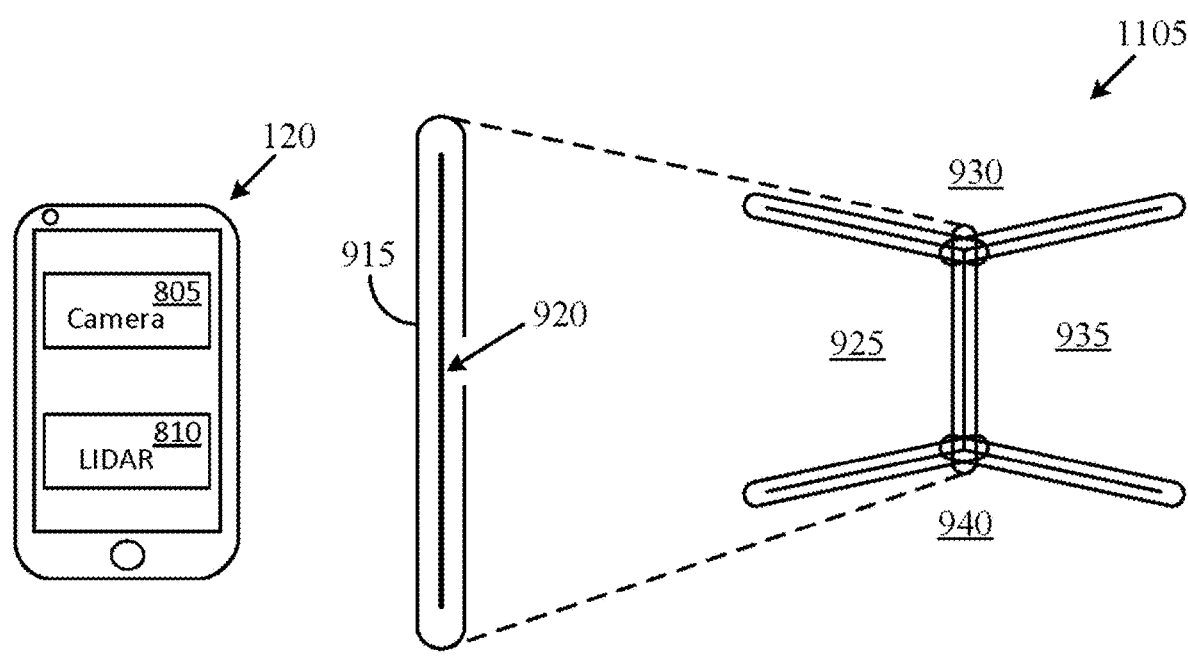
FIG. 11 illustrates a second example segmentation representation associated with an example segmentation procedure to identify an edge in a room in accordance with an embodiment of the disclosure.

FIG. 11 illustrates a second example segmentation representation 1105 associated with an example segmentation procedure to identify various edges and corners of the room 905 described above. In this case, an edge existence probability mask 915 provides an indication of a confidence level associated with identifying the edge 920 in the room 905. The description provided above with respect to FIG. 10 is equally applicable to FIG. 11 and will not be repeated here.

Figure 12:
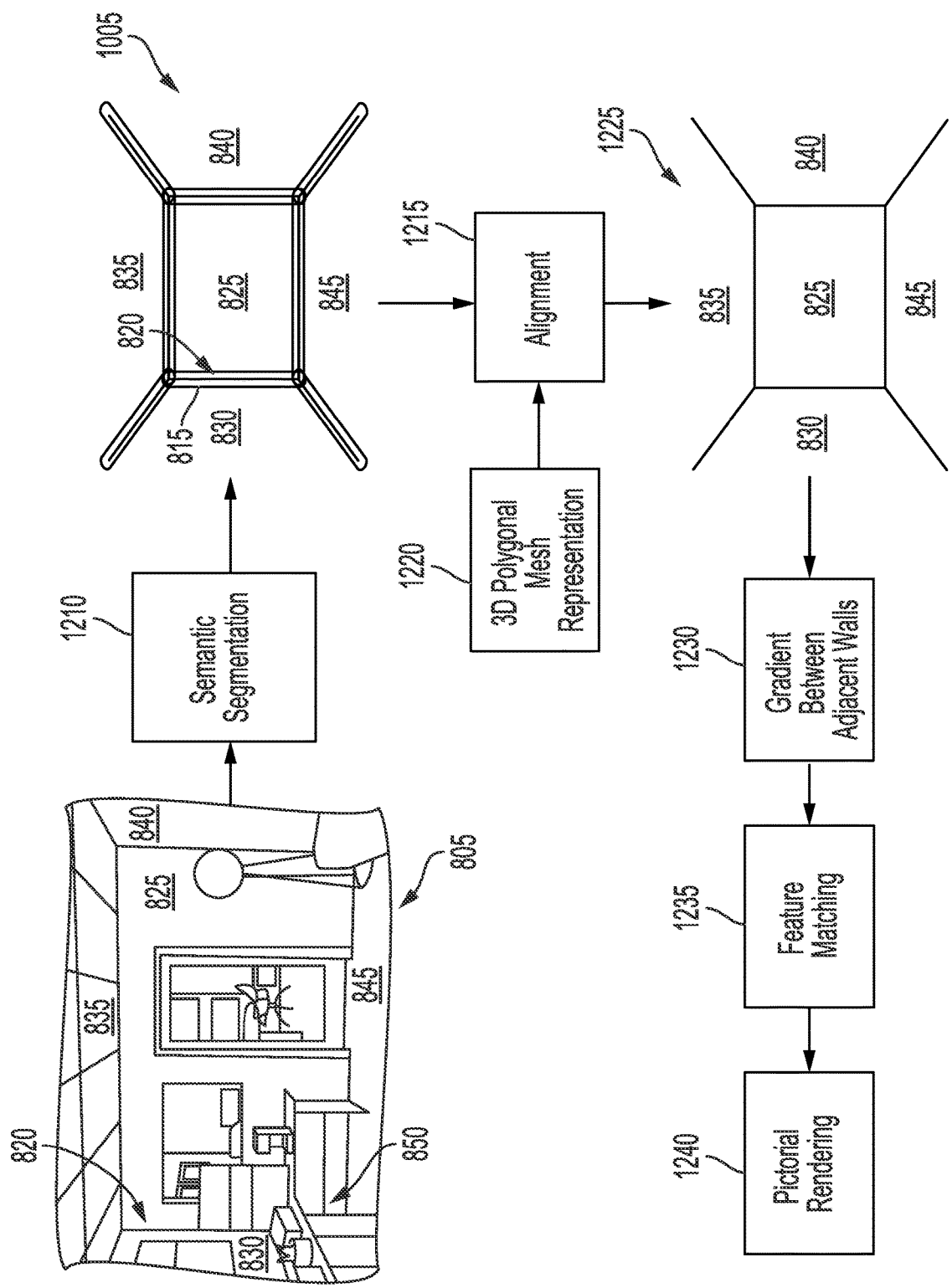
FIG. 12 shows a block diagram of an example procedure to identify and utilize the edges of a room to generate a floorplan in accordance with the disclosure.

FIG. 12 shows a block diagram of an example procedure to identify and utilize the edges of an example room to generate a floorplan in accordance with the disclosure. In this case, the example room is the room 805 shown in FIG. 8. However, the description is equally applicable to various other types of rooms. Semantic segmentation block 1210 may be executed in various ways and subject matter pertaining to this block has been described above with reference to block 720 of FIG. 7 and subsequent figures. In an example implementation, a scene understanding procedure may be executed in order to derive semantic information of a building (interior and exterior portions) or a portion of a building (such as, for example, the room 805). The scene understanding procedure can provide semantic information such as, for example, an identification of objects (such as, for example, the wall 825 and the wall 830 in the room 805), characteristics of objects (such as, for example, planarity, orientation, dimensions, etc. of the wall 825 and the wall 830; location of corners such as the corner 856, for example) and relationships between objects (orientation of the wall 825 with respect to the wall 830, for example).

As described above, the segmentation representation 1005 includes a set of edge existence probability masks that provide an indication of a confidence level associated with identifying each of various wall edges in the room 805. For example, the edge existence probability mask 815 provides an indication of a confidence level associated with identifying the edge 820 in the room 805. Uniquely locating the various edges by use of the set of edge existence probability masks may be carried out by executing block 1215 that involves an alignment operation between the segmentation representation 1005 and a 3D polygonal mesh representation (block 1220) of the room 805.

The segmentation representation 1225, which is produced as a result of the alignment operation can then be operated upon to identify a planarity of each of the various walls. The planarity can be determined by a plane detecting procedure that includes detecting a gradient between adjacent walls (block 1230) such as, for example, between the wall 830 and the wall 825 (after identification of the edge 820 via the alignment operation of block 1215).

Block 1235 pertains to feature matching to determine, for example, the dimensions of each wall. After determining the features, at block 1240, a pictorial rendering of the room 805 can be generated.

Figure 13:
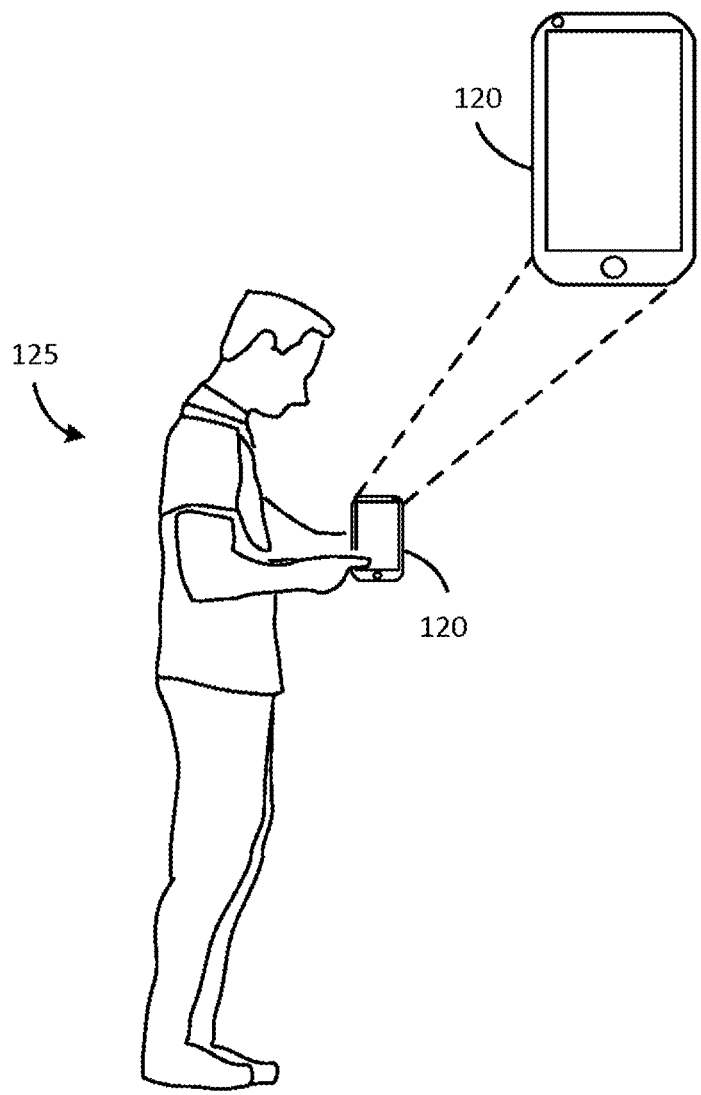
FIG. 13 illustrates a user interacting with a personal device configured to generate the pictorial rendering of at least a portion of a building in accordance with the disclosure.

FIG. 13 illustrates the individual 125 executing a floorplan generation procedure upon a computer, which in this example scenario, is the personal device 120 in accordance with an embodiment of the disclosure. The personal device 120 includes a processor and a memory containing computer-executable instructions. The processor is configured to access the memory and execute the computer-executable instructions to perform operations associated with floorplan generation in accordance with the disclosure.

A first example floorplan generation procedure that generally conforms to the block diagram illustrated in FIG. 7 is executed as a manual operation upon the personal device 120. The manual operation may include actions performed by the individual 125 such as operating the camera of the personal device 120 for capturing a monocular RGB image of a room and operating a LiDAR device of the camera to capture depth information of the room. The processor of the personal device may execute various operations, such as the ones described herein, by use of the monocular RGB image and the depth information. During the operation and at other times, various images may be displayed upon a display screen of the personal device 120. The images can include, for example, the monocular RGB image of the room, a three-dimensional polygonal mesh representation of a room or a building in which the room is located, and/or a pictorial rendering of the room and/or the building in which the room is located.

Some example operations can include room segmentation, corner detection and edge detection. In this scenario, the individual 125 may visually inspect an RGB image and/or a three-dimensional polygonal mesh representation of the RGB image to identify various rooms in a building and segment the three-dimensional polygonal mesh representation into the various rooms. The individual 125 may further identify objects (such as furniture, wall fixtures, wall hangings, floor coverings, etc.) and structural elements (walls, corners, ceiling, floor, doors, windows, etc.) of the room 115.

The actions performed by the individual 125 may be configured to operate as a mentoring tool for teaching the processor to subsequently perform such actions autonomously. An artificial intelligence tool provided in the personal device 120 (in the form of a software program, for example) may employ techniques such as machine-learning and artificial intelligence to learn the actions performed by the individual 125.

A second example floorplan generation procedure that generally conforms to the block diagram illustrated in FIG. 7 is executed as a semi-manual operation upon the personal device 120. The semi-manual operation may include actions performed by the personal device 120 that are monitored, corrected, and modified, on an as-needed basis, by the individual 125. Complementing operations performed by the personal device 120 (particularly operations involving machine learning and/or artificial intelligence techniques) with manual guidance, may be referred to as augmented intelligence.

A third example floorplan generation procedure that generally conforms to the block diagram illustrated in FIG. 7 is executed as a fully autonomous operation by the personal device 120. The fully autonomous operation is generally executed in accordance with the disclosure and can, in one example implementation, involve the use of machine learning models such as, for example, a sequential model that performs room segmentation procedures and a graph-based model that identifies relationships between various rooms.

In an example scenario, the third example floorplan generation procedure (and/or the second example floorplan generation procedure) autonomously identifies the wall 116 (shown in FIG. 1) as a shared wall that is shared between the room 115 and the room 110.

Furthermore, in some scenarios, the third example floorplan generation procedure (and/or the second floorplan generation procedure) may generate some room properties through room sequence prediction using a sequence model. The sequence model may be applied to one or more rooms. It may be desirable to generate two sets of room data in order to obtain information on individual rooms as well to identify how two or more rooms are interconnected.

Converting template floorplans into graphs and using a model that represents graph learning, is one example process to obtain information on how the rooms are interconnected with each other. In an example approach, each room is assumed to be a node and shared walls are assumed as edges. Since graphs do not show a special relationship across rooms, each room may be assigned coordinates in a coordinate plane. For doing so, a graph-to-image algorithm converts a graph of a floorplan to a list of coordinate points, one for each room.

The conversion procedure is carried out under the assumption that the floorplan is autonomously generated by the personal device 120. In this case, the personal device 120 is configured to operate as a simulation engine (with mentorship by the individual 125 who can intervene to choose which rooms the model creates and to autonomously collect the room data). The simulation engine can also be used to generate a randomized dataset that may be used for providing a machine learning framework on various computers.

The process of generating a floorplan from red-green-blue (RGB) information and depth information may be broadly defined by three steps. A first step pertains to image capture, where an image capture device such as, for example, a camera of the personal device 120, is operated to capture a set of RGB images while an individual such as, for example, the individual 125, walks from one room to another room of a building. Distance information associated with each RGB image may be obtained by use of a LiDAR device that can include a time-of-flight (ToF) sensor. Time-related information may be obtained for example, by way of time-stamps generated by the image capture device and attached to captured images during image capture when the individual walks from one room to another.

In one scenario, a software application provided in the personal device 120 generates a floorplan based on the captured information. In another scenario, the captured information is propagated to a cloud-based device (the computer 130, for example) that generates a floorplan based on the captured information. Some aspects pertaining to generation of a floorplan have been described above. Additional aspects pertaining to generating a floorplan can include use of the time-related information (which may also be considered as odometry information). The odometry information is obtained from successive frames of an RGB image and used to generate a pose graph. The pose graph may be optimized to estimate a trajectory of motion of the image capture device and/or to determine camera pose. 3D point cloud fragments may be formed by projecting 2D pixels into a 3D space. A global pose graph may then be generated by matching corresponding features in various 3D fragments and by use of a feedback generation procedure. The global pose graph may be used for executing a floorplan estimation procedure. The floorplan estimation procedure can include an optimization pipeline to fit alpha shapes (linear simple curves that can be used for shape reconstruction) with a deep learning pipeline to predict the best-fit corners of each room point cloud. As a result, polygons that best describe each of the rooms present in the global point cloud are estimated. Finally, these polygons are stitched together by referring to the global point cloud and can be used as a usable 2D floor map of a room or a set of rooms.

One of the challenges in obtaining a room layout of an industrial building or a commercial building pertains to a size of such buildings. In such cases, a scalable solution may be applied that includes the use of multiple devices (image capture device, sensor devices etc.) rather than a single device, and infrastructure elements that support such devices (such as, for example, a 5G network). A scalable solution may further involve, for example, a fog-computing paradigm, fast data acquisition, and processing by leveraging distributed processing techniques in which multiple agents are used for mapping different parts of a building. The various images and/or three-dimensional polygonal mesh representations of various areas of a building may then be operated upon in a collective manner to generate a comprehensive floorplan of the entire building.

Figure 14:
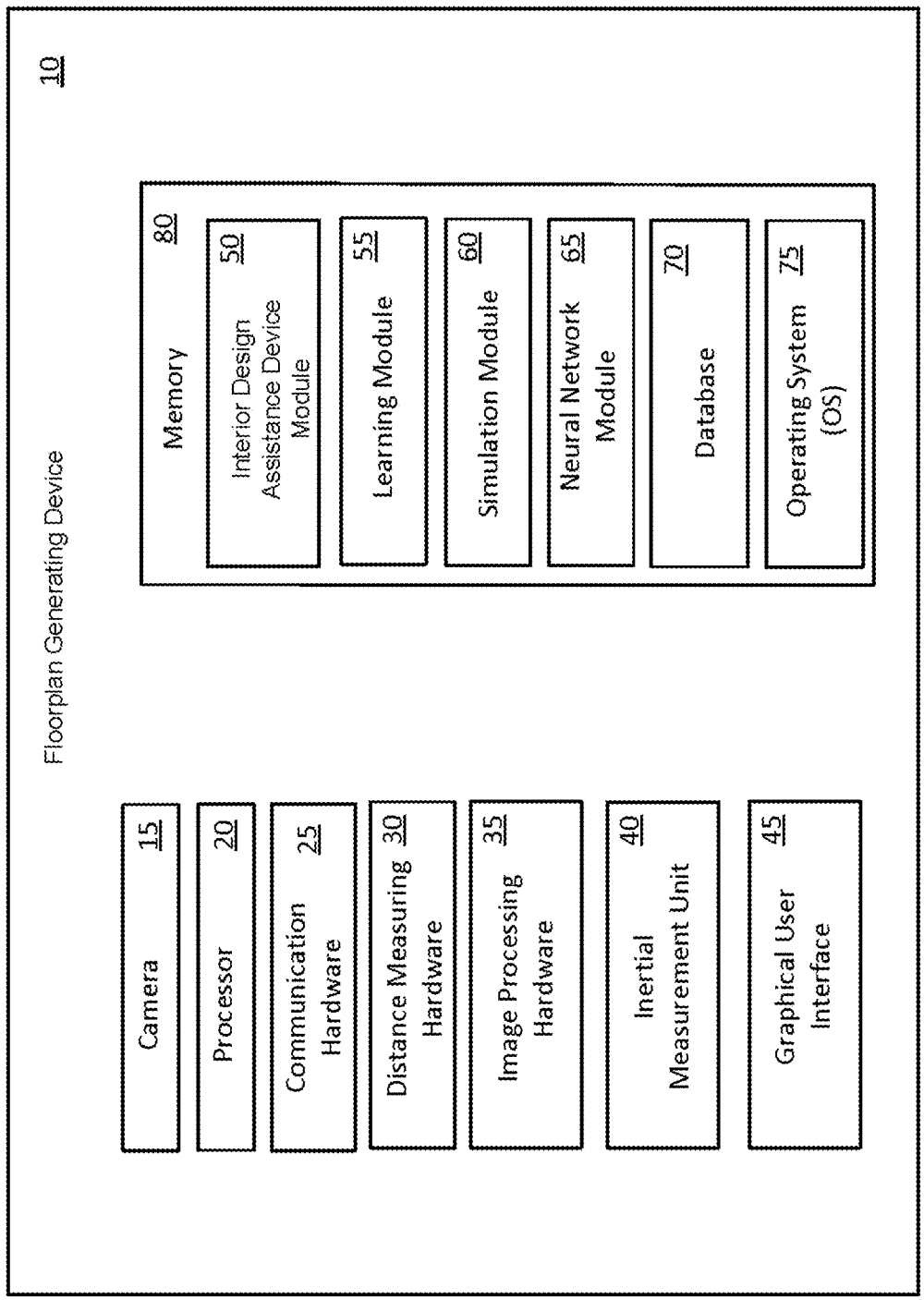
FIG. 14 shows some example components that may be provided in a floorplan generating device in accordance with an embodiment of the disclosure.

FIG. 14 shows some example components that may be provided in a floorplan generating device 10 in accordance with an embodiment of the disclosure. The floorplan generating device 10 can be implemented in various forms such as, for example, the personal device 120, the computer 130, or the computer 140 described above. Generally, in terms of hardware architecture, the floorplan generating device 10 can include a camera 15, a processor 20, communication hardware 25, distance measuring hardware 30, image processing hardware 35, an inertial measurement unit (IMU) 40, a graphical user interface 45, and a memory 80. In various other implementations, components such as, for example, a gyroscope and a flash unit can be included in the floorplan generating device 10. The various components may be communicatively coupled to each other via an interface (not shown). The interface can be, for example, one or more buses or other wired or wireless connections.

The communication hardware 25 can include a receiver and a transmitter (or a transceiver) configured to support communications between the floorplan generating device 10 and other devices such as, for example, the cloud storage device 135. The distance measuring hardware 30 can include, for example, a LiDAR device and/or a time-of-flight (ToF) system that may use a laser beam to determine a distance between the floorplan generating device 10 (when the floorplan generating device 10 is the personal device 120, for example) and an object or structure in a room, when the floorplan generating device 10 is used to capture images of the object or structure.

The image processing hardware 35 can include a graphics processing unit (GPU) configured to process images captured by the camera 15 of the floorplan generating device 10. The images may be captured by use of the camera 15 in the floorplan generating device 10 (when the floorplan generating device 10 is the personal device 120, for example) or may be loaded into the floorplan generating device 10 from another device (when the floorplan generating device 10 is the computer 130 or the computer 140).

The processor 20 is configured to execute a software application stored in the memory 80 in the form of computer-executable instructions. The processor 20 can be any custom made or commercially available processor, a central processing unit (CPU), an auxiliary processor among several processors associated with the floorplan generating device 10, a semiconductor-based microprocessor (in the form of a microchip or chip set), a macroprocessor, or generally any device for executing software instructions.

The memory 80, which is one example of a non-transitory computer-readable storage medium, may be used to store an operating system (OS) 75, a database 70, and code modules such as a floorplan generating module 50, a learning module 55, a simulation module 60, and a neural network module 65. In an example application, the memory 80 can further include application specific modules such as, for example, an interior design assistance module (not shown) that may be executed by the processor 20 to provide interior design assistance to as individual such as, for example, the individual 125. The database 65 may be used to store items such as RGB images, depth information, and/or floorplans of various buildings.

The code modules are provided in the form of computer-executable instructions that can be executed by the processor 20 for performing various operations in accordance with the disclosure. In an example embodiment where the floorplan generating device 10 is the personal device 120, some or all of the code modules may be downloaded into the floorplan generating device 10 from the computer 130 or the cloud storage device 135.

More particularly, the floorplan generating module 50 can be executed by the processor 20 for performing some or all operations associated with the functional blocks shown in FIG. 7 and other figures such as FIG. 12 and FIG. 14 (described below). The processor 20 may execute the learning module 55 for executing the various learning procedures described above. The processor 20 may execute the simulation module 60 for executing the various simulation procedures described above. The processor 20 may execute the neural network module 65 for executing the various procedures described above such as, for example, a segmentation procedure to identify one or more edges of a room.

The memory 80 can include any one or a combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 80 may incorporate electronic, magnetic, optical, and/or other types of storage media. Note that the memory 80 can have a distributed architecture, where various components are situated remote from one another, but can be accessed by the processor 20.

The operating system 70 essentially controls the execution of various software programs in the floorplan generating device 10, and provides services such as scheduling, input-output control, file and data management, memory management, and communication control.

Some or all of the code modules may be provided in the form of a source program, an executable program (object code), a script, or any other entity comprising a set of instructions to be performed. When a source program, the program may be translated via a compiler, assembler, interpreter, or the like, which may or may not be included within the memory 80, so as to operate properly in connection with the O/S 70. Furthermore, some or all of the code modules may be written as (a) an object-oriented programming language, which has classes of data and methods, or (b) a procedure programming language, which has routines, sub-routines, and/or functions, for example but not limited to, C, C++, Pascal, Basic, Fortran, Cobol, Perl, Java, and Ada.

In some cases, where the floorplan generating device 10 is a laptop computer, desktop computer, workstation, or the like, the software in the memory 80 may further include a basic input output system (BIOS) (omitted for simplicity). The BIOS is a set of essential software routines that initialize and test hardware at startup, start the O/S 70, and support the transfer of data among various hardware components. The BIOS is stored in ROM so that the BIOS can be executed when the floorplan generating device 10 is powered up.

In general, the various operations that can be performed by the floorplan generation device 10 are directed at generating a pictorial rendering of a structure such as, for example, a room of a building or multiple rooms of a building. The pictorial rendering can be provided in any of various forms such as, for example, a floorplan, a three-dimensional (3D) drawing, an isometric view of a building, a birds-eye view of a building, an interior view of a room in a building, or a computer-aided design (CAD) image of a room in a building. The pictorial rendering can be used for many different applications. In one example application, the pictorial rendering is used for providing interior design assistance to an individual. This aspect is described below in more detail using another figure.

Figure 15:
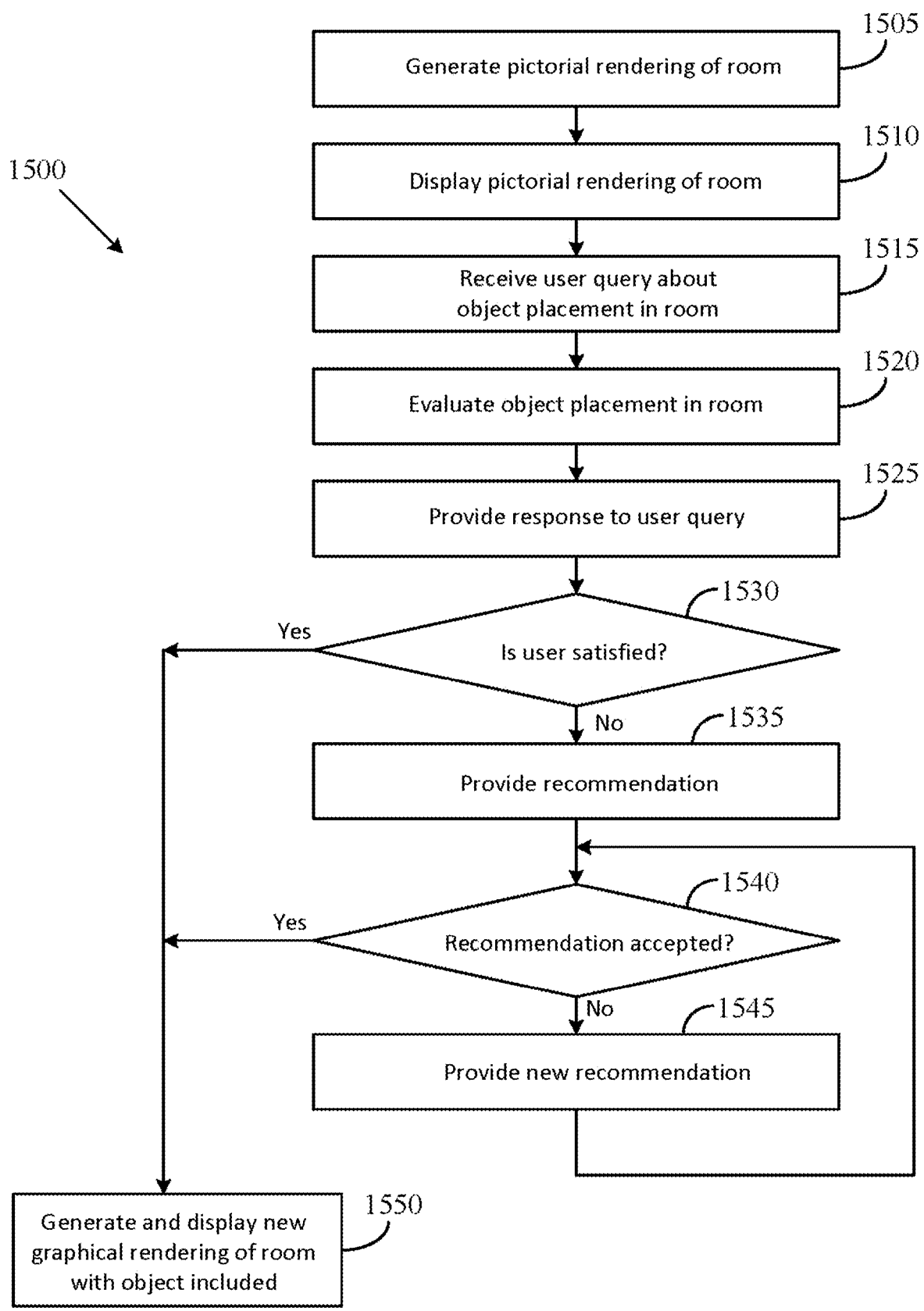
FIG. 15 shows an example flowchart of a method to provide interior design assistance using a pictorial rendering of a room that is generated in accordance with the disclosure.

FIG. 15 shows an example flowchart 1500 of a method to provide interior design assistance using a pictorial rendering of a room that is generated in accordance with the disclosure. It must be understood that any method steps or blocks shown in FIG. 15 may represent modules, segments, or portions of code that include one or more executable instructions for implementing specific logical functions or steps in the method. In certain implementations, one or more of the steps may be performed manually. It will be appreciated that, although particular example method steps are described below, additional steps or alternative steps may be utilized in various implementations without detracting from the spirit of the invention. Moreover, steps may be executed out of order from that shown or discussed, including substantially concurrently or in reverse order, depending on various alternative implementations. Code may be also contained in one or more devices, and may not be necessarily confined to any particular type of device. The explanation below, while possibly implying code residency and functionality in certain devices, does so solely for the purposes of explaining concepts behind the invention, and should not be construed in a limiting manner. Thus, for example, various aspects described below with reference to the processor 20 of the personal device 120 is equally applicable to a processor of any other computing device such as, for example, the computer 130 shown in FIG. 1.

At block 1505, a first pictorial rendering of a room is generated. In an example implementation, the first pictorial rendering can be generated by the processor 20 of the personal device 120. The generation can be carried out by using the various actions and procedures described above such as, for example, with reference to FIG. 7 and FIG. 12.

At block 1510, the first pictorial rendering can be displayed on a display screen of a device such as, for example, on a display screen of the personal device 120. An individual, such as, for example, the individual 125 shown in FIG. 1, can view the first pictorial rendering and make a determination whether he/she would prefer to modify some aspects of the room, particularly, from an interior design perspective. The interior design perspective may involve one or more actions such as, for example, placement of a new object in the room, replacing an object present in the room, repositioning an object present in the room, and/or modifying an appearance of an object in the room. The object can be any of various items such as, for example, a piece of furniture (the table 850 shown in FIG. 8, for example), a decorative object (a painting, a sculpture, a photograph, etc.), a wall fixture (a wall shelf, a light fixture, etc.), a floor covering (an area rug, for example), or a utility object (a television set, a refrigerator, an oven, etc.). The room can include various structures such as, for example, walls, windows, doors, and a fireplace, that the individual may prefer to modify, replace, or remove. Modifying a structure can include, for example, changing a size of the wall, changing a shape of a wall, and/or changing a color of a wall.

At block 1515, the processor 20 of the personal device 120 may receive a query from the individual about an interior design action that the individual may desire to undertake. One example of an interior design action (among the several example actions described above) is placement of an object in the room (a sofa, for example).

At block 1520, the processor 20 evaluates placement of the object in the room. The evaluation can include operations such as comparing a dimension of a part of the room (wall, floor, etc.) to a dimension of the object (height, width, depth, etc.) or a footprint of the object. Thus, for example, the processor 20 may autonomously evaluate a shape, size, and color of a sofa to a shape, size, and color of a wall of the room, an available floor space for placement of the sofa, color coordination between a color of the sofa and one or more objects in the room, etc.

At block 1525, the processor 20 may provide a response to the query. In an example scenario, the response can be provided in the form of a second pictorial rendering of the room with the sofa placed in the room.

At block 1530, a determination is made whether the individual is satisfied with the response provided by the processor 20.

If the individual is dissatisfied with the placement, at block 1535, the processor 20 provides a recommendation. In an example scenario, the recommendation can involve placement of the sofa at a different location and/or a re-orientation of the sofa.

At block 1540, a determination is made whether the recommendation is acceptable to the individual.

If the individual is dissatisfied with the placement, at block 1545, the processor 20 provides another recommendation. In some cases, the operations indicated in block 1545 and block 1540 can be performed recursively until the individual accepts a recommendation (block 1540). In some cases, the individual can terminate the operations at any moment in time if dissatisfied.

However, if at block 140 (or at block 1530), the individual accepts a recommendation made by the computer, at block 1550, a third pictorial rendering of the room with the sofa included may be displayed.

In an example scenario, the processor 20 may execute additional operations such as, for example, displaying a set of images that permit the individual to carry out an online transaction associated with the sofa (or any other object pertaining to interior decoration of the room). The online transaction can pertain, for example, a purchase of an object to be placed in the room based on the interior design interaction with the computer. The object may be one that is displayed on a website of a retailer so as to promote sales of various products such as furniture.

The implementations of this disclosure can correspond to methods, apparatuses, systems, non-transitory computer readable media, devices, and the like for generating a floorplan of a building and/or a pictorial rendering of a room of the building. In some implementations, a method includes receiving, by a computer, an image and depth information of at least a portion of a building; generating, by the computer, based on the image, an edge existence probability mask that represents a confidence level associated with identifying an edge of a wall in the at least the portion of the building; executing, by the computer, a recursive procedure that uses the depth information to optimize the edge existence probability mask; executing, by the computer, a scene understanding procedure to derive semantic information of the at least the portion of the building; identifying, by the computer, the edge of the wall based on the optimized edge existence probability mask and the semantic information of the at least the portion of the building; and generating, by the computer, a pictorial rendering of the at least the portion of the building, the pictorial rendering including the edge of the wall.

In some implementations of the method, the edge existence probability mask encompasses an area that straddles the edge of the wall and extends over at least a portion of a length of the edge of the wall, and the recursive procedure comprises execution of a neural network procedure.

In some implementations of the method, the neural network procedure is based on a machine learning operation that configures the computer to autonomously replicate actions performed by one or more individuals to identify one or more walls of one or more rooms of one or more buildings.

In some implementations of the method, generating the edge existence probability mask comprises executing a segmentation procedure upon a section of the monocular RGB image that includes a visible portion of the edge of the wall and an occluded portion of the edge of the wall.

In some implementations of the method wherein at least the portion of the building includes a room of the building, the method further comprises displaying, by the computer, the pictorial rendering of the room upon a display screen of the computer; receiving, by the computer, a query associated with an interior design of the room; and generating, by the computer, a response to the query, the response comprising one of a first recommendation to place a first object at a first location in the room, a second recommendation to place the first object at a second location in the room, or a third recommendation to place a second object at one of the first location or the second location in the room.

In some implementations of the method, at least one of the first object or the second object is one of a piece of furniture, a decorative object, or a utility object, and wherein one of providing the first recommendation or the second recommendation is based at least in part on matching a first property of the at least one of the first object or the second object with a second property of at least the wall of the room.

In some implementations of the method, the first property comprises at least one of a size of the first object, a shape of the first object, or a color of the first object and wherein the second property comprises at least one of a size of the wall, a shape of the wall, or a color of the wall.

In some implementations of a method includes receiving, by a computer, from a camera, an image of at least a portion of a building; receiving, by the computer, from a light detection and ranging (LiDAR) device, depth information associated with the at least the portion of the building; generating, by the computer, based on at least one of the image or a combination of the image and the depth information, semantic information of the at least the portion of the building; generating, by the computer, based on the monocular RGB image, an edge existence probability mask that represents a confidence level associated with identifying an edge of a wall in the at least the portion of the building; executing, by the computer, a recursive procedure that comprises a use of the depth information to optimize the edge existence probability mask; identifying, by the computer, the edge of the wall based on combining the optimized edge existence probability mask with the semantic information of the at least the portion of the building; and generating, by the computer, a pictorial rendering of the at least the portion of the building, the pictorial rendering including the edge of the wall.

In some implementations of the method, the edge existence probability mask represents a confidence level associated with identifying the edge of the wall in the room.

In some implementations of the method, the edge existence probability mask is a template that encompasses the edge of the wall and extends over at least a first portion of a length of the edge of the wall, and wherein the recursive procedure comprises execution of a neural network procedure.

In some implementations of the method, wherein the at least the portion of the building includes a first room of the building, and wherein a second portion of the length of the edge of the wall is occluded by an object that is present in the room In some implementations of the method, generating the edge existence probability mask comprises executing a segmentation procedure upon a section of the image that includes a visible portion of the edge of the wall and an occluded portion of the edge of the wall.

In some implementations of the method further comprises displaying, by the computer, the pictorial rendering of the at least the portion of the building upon a display screen of the computer; receiving, by the computer, a query associated with an interior design of the first room; evaluating, by the computer, at least one of a first property of the first room or a second property of an adjacent room, and generating, by the computer, based on evaluating the at least one of the first property of the first room or the second property of the adjacent room, a response to the query, the response comprising one of a first recommendation to place a first object at a first location in the first room, a second recommendation to place the first object at a second location in the first room, or a third recommendation to place a second object at one of the first location or the second location in the first room.

In some implementations of the method, the response to the query is generated by execution of an artificial intelligence (AI) procedure in the computer.

In some implementations, a system includes a camera, a light detection and ranging (LiDAR) device, and a computer. The computer includes a processor and a memory containing computer-executable instructions. The processor is configured to access the memory and execute the computer-executable instructions to receive, from the camera, an image of at least a portion of a building; receive, from the LiDAR device, depth information associated with the at least portion of the building; generate, based on at least one of the image or a combination of the image and the depth information, semantic information of the at least the portion of the building; generate, based on the image, an edge existence probability mask that represents a confidence level associated with identifying an edge of a wall in the at least portion of the building; execute a recursive procedure that comprises a use of the depth information to optimize the edge existence probability mask; identify the edge of the wall in the room based on combining the optimized edge existence probability mask with the sematic information of the at least the portion of the building; and generate a pictorial rendering of the at least the portion of the building, the pictorial rendering including the edge of the wall.

In some implementations of the system, the computer is a personal device, the edge existence probability mask encompasses an area that straddles the edge of the wall and extends over at least a portion of a length of the edge of the wall, and the recursive procedure comprises execution of a neural network procedure.

In some implementations of the system, the neural network procedure is based on a machine learning operation that configures the computer to autonomously replicate actions performed by one or more individuals to identify one or more walls of one or more rooms of one or more buildings.

In some implementations of the system further includes a display device, and the processor is further configured to access the memory and execute the computer-executable instructions to display the pictorial rendering of the at least the portion of the building upon a display screen of the display device; receive a query associated with an interior design of a room that is included in the at least the portion of the building; and generate a response to the query, the response comprising one of a first recommendation to place a first object at a first location in the room, a second recommendation to place the first object at a second location in the room, or a third recommendation to place a second object at one of the first location or the second location in the room.

In some implementations of the system, at least one of the first object or the second object is one of a piece of furniture, a decorative object, or a utility object, and wherein one of providing the first recommendation or the second recommendation is based at least in part on matching a first property of the at least one of the first object or the second object with a second property of at least the wall of the room.

In some implementations of the system, the first property comprises at least one of a size of the first object, a shape of the first object, or a color of the first object and wherein the second property comprises at least one of a size of the wall, a shape of the wall, or a color of the wall.

The implementations of this disclosure can be described in terms of functional block components and various processing operations. Such functional block components can be realized by a number of hardware or software components that perform the specified functions. For example, the disclosed implementations can employ various integrated circuit components (e.g., memory elements, processing elements, logic elements, look-up tables, and the like), which can carry out a variety of functions under the control of one or more microprocessors or other control devices. Similarly, where the elements of the disclosed implementations are implemented using software programming or software elements, the systems and techniques can be implemented with a programming or scripting language, such as C, C++, Java, JavaScript, assembler, or the like, with the various algorithms being implemented with a combination of data structures, objects, processes, routines, or other programming elements.

Functional aspects can be implemented in algorithms that execute on one or more processors. Furthermore, the implementations of the systems and techniques disclosed herein could employ a number of conventional techniques for electronics configuration, signal processing or control, data processing, and the like. The words "mechanism" and component" are used broadly and are not limited to mechanical or physical implementations, but can include software routines in conjunction with processors, etc. Likewise, the terms "system" or "tool" as used herein and in the figures, but in any event based on their context, may be understood as corresponding to a functional unit implemented using software, hardware (e.g., an integrated circuit, such as an ASIC), or a combination of software and hardware. In certain contexts, such systems or mechanisms may be understood to be a processor-implemented software system or processor-implemented software mechanism that is part of or callable by an executable program, which may itself be wholly or partly composed of such linked systems or mechanisms.

Implementations or portions of implementations of the above disclosure can take the form of a computer program product accessible from, for example, a computer-usable or computer-readable medium. A computer-usable or computer-readable medium can be a device that can, for example, tangibly contain, store, communicate, or transport a program or data structure for use by or in connection with a processor. The medium can be, for example, an electronic, magnetic, optical, electromagnetic, or semiconductor device.

Other suitable mediums are also available. Such computer-usable or computer-readable media can be referred to as non-transitory memory or media, and can include volatile memory or non-volatile memory that can change over time. The quality of memory or media being non-transitory refers to such memory or media storing data for some period of time or otherwise based on device power or a device power cycle. A memory of an apparatus described herein, unless otherwise specified, does not have to be physically contained by the apparatus, but is one that can be accessed remotely by the apparatus, and does not have to be contiguous with other memory that might be physically contained by the apparatus.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

That which is claimed is:

1. A method comprising:
receiving, by a computer, an image and depth information of at least a portion of a building;
generating, by the computer, based on the image, an edge existence probability mask by executing a segmentation procedure upon a section of the image that includes a visible portion of an edge of a wall and an occluded portion of the edge of the wall using a three-dimensional recursive method that handles occlusions, wherein the edge existence probability mask represents a confidence level associated with identifying the edge of the wall in the at least the portion of the building;
executing, by the computer, a recursive procedure that uses the depth information to optimize the edge existence probability mask;
executing, by the computer, a scene understanding procedure to derive semantic information of the at least the portion of the building;
identifying, by the computer, the edge of the wall based on the optimized edge existence probability mask and the semantic information of the at least the portion of the building; and
generating, by the computer, a pictorial rendering of the at least the portion of the building, the pictorial rendering including the edge of the wall.

2. The method of claim 1, wherein the edge existence probability mask encompasses an area that straddles the edge of the wall and extends over at least a portion of a length of the edge of the wall, and wherein the recursive procedure comprises execution of a neural network procedure.

3. The method of claim 2, wherein the neural network procedure is based on a machine learning operation that configures the computer to autonomously replicate actions performed by one or more individuals to identify one or more walls of one or more rooms of one or more buildings.

4. The method of claim 2, wherein the at least the portion of the building includes a room of the building, and wherein the method further comprises:
displaying, by the computer, the pictorial rendering of the room upon a display screen of the computer;
receiving, by the computer, a query associated with an interior design of the room; and
generating, by the computer, a response to the query, the response comprising one of a first recommendation to place a first object at a first location in the room, a second recommendation to place the first object at a second location in the room, or a third recommendation to place a second object at one of the first location or the second location in the room.

5. The method of claim 4, wherein at least one of the first object or the second object is one of a piece of furniture, a decorative object, or a utility object, and wherein one of providing the first recommendation or the second recommendation is based at least in part on matching a first property of the at least one of the first object or the second object with a second property of at least the wall of the room.

6. The method of claim 5, wherein the first property comprises at least one of a size of the first object, a shape of the first object, or a color of the first object and wherein the second property comprises at least one of a size of the wall, a shape of the wall, or a color of the wall.

7. A method comprising:
receiving, by a computer, from a camera, an image of at least a portion of a building;

receiving, by the computer, from a light detection and ranging (LiDAR) device, depth information associated with the at least the portion of the building;
generating, by the computer, based on at least one of the image or a combination of the image and the depth information, semantic information of the at least the portion of the building;
generating, by the computer, based on the image, an edge existence probability mask by executing a segmentation procedure upon a section of the image that includes a visible portion of an edge of a wall and an occluded portion of the edge of the wall using a three-dimensional recursive method that handles occlusions, wherein the edge existence probability mask represents a confidence level associated with identifying the edge of the wall in the at least the portion of the building;
executing, by the computer, a recursive procedure that comprises a use of the depth information to optimize the edge existence probability mask;
identifying, by the computer, the edge of the wall based on combining the optimized edge existence probability mask with the semantic information of the at least the portion of the building; and
generating, by the computer, a pictorial rendering of the at least the portion of the building, the pictorial rendering including the edge of the wall.

8. The method of claim 7, wherein the edge existence probability mask is a template that encompasses the edge of the wall and extends over at least a first portion of a length of the edge of the wall, and wherein the recursive procedure comprises execution of a neural network procedure.

9. The method of claim 8, wherein the at least the portion of the building includes a first room of the building, and wherein a second first portion of the length of the edge of the wall is occluded by an object that is present in the first room.

10. The method of claim 9, further comprising:
displaying, by the computer, the pictorial rendering of the at least the portion of the building upon a display screen of the computer;
receiving, by the computer, a query associated with an interior design of the first room;
evaluating, by the computer, at least one of a first property of the first room or a second property of an adjacent room; and
generating, by the computer, based on evaluating the at least one of the first property of the first room or the second property of the adjacent room, a response to the query, the response comprising one of a first recommendation to place a first object at a first location in the first room, a second recommendation to place the first object at a second location in the first room, or a third recommendation to place a second object at one of the first location or the second location in the first room.

11. The method of claim 10, wherein the response to the query is generated by execution of an artificial intelligence (AI) procedure in the computer.

12. A system comprising:
a camera;
a light detection and ranging (LiDAR) device; and
a computer comprising:
a memory that stores computer-executable instructions; and
a processor configured to access the memory and execute the computer-executable instructions to at least:
receive, from the camera, an image of at least a portion of a building;
receive, from the LiDAR device, depth information associated with the at least the portion of the building;
generate, based on at least one of the image or a combination of the image and the depth information, semantic information of the at least the portion of the building;
generate, based on the image, an edge existence probability mask by executing a segmentation procedure upon a section of the image that includes a visible portion of an edge of a wall and an occluded portion of the edge of the wall using a three-dimensional recursive method that handles occlusions, wherein the edge existence probability mask represents a confidence level associated with identifying the edge of the wall in the at least the portion of the building;
execute a recursive procedure that comprises a use of the depth information to optimize the edge existence probability mask;
identify the edge of the wall based on combining the optimized edge existence probability mask with the semantic information of the at least the portion of the building; and
generate a pictorial rendering of the at least the portion of the building, the pictorial rendering including the edge of the wall.

13. The system of claim 12, wherein the computer is a personal device, wherein the edge existence probability mask encompasses an area that straddles the edge of the wall and extends over at least a portion of a length of the edge of the wall, and wherein the recursive procedure comprises execution of a neural network procedure.

14. The system of claim 13, wherein the neural network procedure is based on a machine learning operation that configures the computer to autonomously replicate actions performed by one or more individuals to identify one or more walls of one or more rooms of one or more buildings.

15. The system of claim 13, further comprising a display device, and wherein the processor is further configured to access the memory and execute the computer-executable instructions to at least:
display the pictorial rendering of the at least the portion of the building upon a display screen of the display device;
receive a query associated with an interior design of a room that is included in the at least the portion of the building; and
generate a response to the query, the response comprising one of a first recommendation to place a first object at a first location in the room, a second recommendation to place the first object at a second location in the room, or a third recommendation to place a second object at one of the first location or the second location in the room.

16. The system of claim 15, wherein at least one of the first object or the second object is one of a piece of furniture, a decorative object, or a utility object, and wherein one of providing the first recommendation or the second recommendation is based at least in part on matching a first property of the at least one of the first object or the second object with a second property of at least the wall of the room.

17. The system of claim 16, wherein the first property comprises at least one of a size of the first object, a shape of the first object, or a color of the first object and wherein the second property comprises at least one of a size of the wall, a shape of the wall, or a color of the wall.

* * * * *